Figure 1:
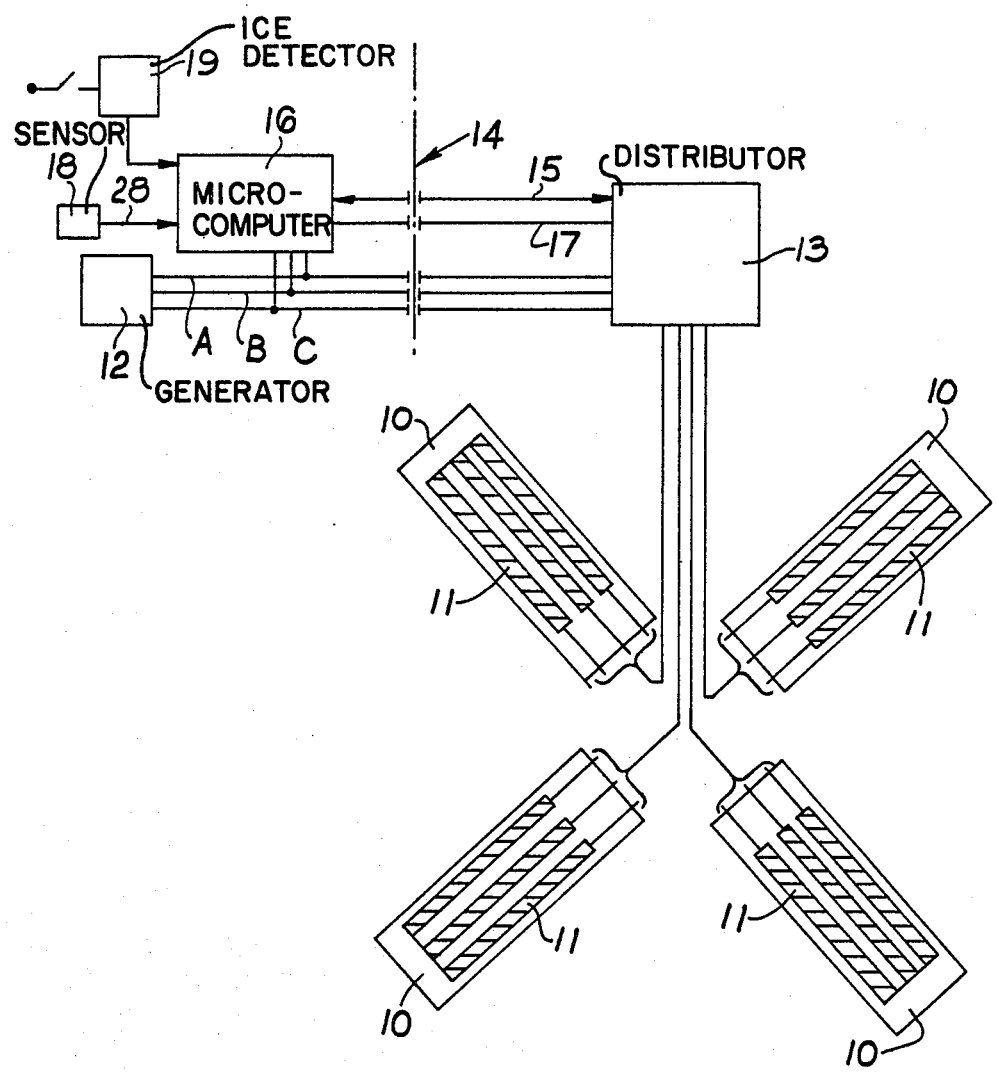

United States Patent [19]

Williams

[11] 4,410,794
[45] Oct. 18, 1983

[54] SWITCHING SYSTEM FOR CYCLIC SUPPLY OF ELECTRICAL POWER TO A PLURALITY OF LOADS

[75] Inventor: David C. Williams, Kings Langley, England

[73] Assignee: Lucas Industries Limited, Birmingham, England

[21] Appl. No.: 258,722

[22] Filed: Apr. 29, 1981

[30] Foreign Application Priority Data

May 8, 1980 [GB] United Kingdom ............... 8015301

[51] Int. Cl.³ ............................................. H05B 1/02
[52] U.S. Cl. .................................. 219/486; 219/483; 219/508; 219/201; 323/272; 323/319; 307/40; 307/41; 244/134 R; 244/134 D
[58] Field of Search ....................... 219/201, 483–486, 219/492, 497, 508–510; 323/235, 319, 267, 271, 272; 307/38–41; 244/134 R, 134 C, 134 D

[56] References Cited

U.S. PATENT DOCUMENTS

| | | | |
|---|---|---|---|
| 3,417,320 | 12/1968 | Muskovac | 323/236 |
| 3,496,331 | 2/1970 | Fleury et al. | 219/201 |
| 3,586,869 | 6/1971 | Kompelien | 307/41 |
| 3,855,452 | 12/1974 | Flaza et al. | 219/492 |
| 4,010,412 | 3/1977 | Forman | 323/18 |
| 4,174,496 | 11/1979 | McFall et al. | 323/235 |
| 4,282,422 | 8/1981 | Payne et al. | 219/486 |
| 4,292,502 | 9/1981 | Adams | 219/486 |

FOREIGN PATENT DOCUMENTS 14334  8/1980  European Pat. Off. .

Primary Examiner—M. H. Paschall
Attorney, Agent, or Firm—Ferguson, Baker, Whitham, Spooner, and Kroboth

[57] ABSTRACT

A switching system for sequential connection of a plurality of loads to an alternating current supply comprises a computer for generating switch selection data in the form of serial bits along a single line to a distributor arrangement which decodes the selection data and provides control signals to switch devices which connect the loads to the supply. The distributor arrangement includes a circuit for inhibiting supply of the control signals to the respective switch devices unless the voltage of the supply phase connected by the device is substantially zero. Additionally the control signals are time-advanced with respect to the zero voltage conditions so that the switch devices can be placed in states in which they can connect a load before disconnection of a preceding load.

8 Claims, 25 Drawing Figures

|   |   | Va=0 ↑ | Va=0 ↓ | Vb=0 ↑ | Vb=0 ↓ | Vc=0 ↑ | Vc=0 ↓ | Vac=0 ↑ | Vac=0 ↓ | 112=1 | 113=1 |
|---|---|---|---|---|---|---|---|---|---|---|---|
| I | 149 | 1 | 1 | 1 | 1 | O | 1 | 1 | 1 | 1 | O |
|   |     | 1 | 1 | 1 | 1 | 1 | 1 | 1 | O | O | 1 |
|   | 150 | 1 | 1 | 1 | 1 | 1 | O | 1 | 1 | 1 | O |
|   |     | 1 | 1 | 1 | 1 | 1 | 1 | O | 1 | O | 1 |
|   | 155 | 1 | 1 | O | 1 | 1 | 1 | 1 | 1 | 1 | O |
|   | 156 | 1 | 1 | 1 | O | 1 | 1 | 1 | 1 | 1 | O |
|   | 160 | O | 1 | 1 | 1 | 1 | 1 | 1 | 1 | 1 | O |
|   |     | 1 | 1 | 1 | 1 | 1 | 1 | O | 1 | O | 1 |
|   | 161 | 1 | O | 1 | 1 | 1 | 1 | 1 | 1 | 1 | O |
|   |     | 1 | 1 | 1 | 1 | 1 | 1 | 1 | O | O | 1 |

*Fig. 22*

SWITCHING SYSTEM FOR CYCLIC SUPPLY OF ELECTRICAL POWER TO A PLURALITY OF LOADS

This invention relates to switching systems for sequential connection of a plurality of loads to an electrical supply. In particular the invention relates to such systems when intended for transfer of electrical supply between the heater loads of an aircraft de-icing system.

It is known, for example, from U.S. Pat. No. 3,496,331, to provide a switching system in which a voltage supply is switched so as to be applied sequentially to groups of heaters in an aircraft de-icing system. Though sequential energisation of the heater groups has the effect of reducing the power required, the individual heater groups nevertheless impose substantial loads on a generator. The foregoing prior art discloses that switching is performed at zero voltage conditions of the phases of the supply, so that the switching devices are not required to make and break high currents. The prior art system requires that pauses occur between energisations of successive heater groups. The load on the supply generator will thus vary by the amounts of the heater loads.

Where the individual loads have a power consumption which is large in relation to the output of a generator from which the power is drawn, switching between loads can impose shocks on the generator, its prime mover, and any transmission system between the generator and prime mover. In the prior art system it is therefore necessary to construct the generator and its drive sufficiently robustly to withstand these shock loads, and such construction may impose an undesirable weight penalty, particularly in aircraft de-icing systems. It is one object of the invention to provide a switching system wherein shocks accompanying a transfer of power between loads are reduced.

Switching of the high currents associated with aircraft de-icing heaters can give rise to severe radio frequency interference. The electrical supply for such purposes is normally an alternating supply and it is a further object of the invention to provide a system in which transfer of the alternating supply takes place at zero volt conditions in each phase of the supply.

In particular, when the electrical supply is three phase, it is an object to provide that transfer of the supply is initiated at zero voltage conditions between the respective phases.

Zero voltage switching is best effected by solid state devices such as thyristors. It is yet another object of the invention to provide a system which includes thyristor switching devices, and in which the gate signals, for the respective thyristors appropriate to directions of current flow in the supply phases, are applied before the zero voltage cross-over points corresponding to the respective current flows, whereby switching of each supply phase occurs substantially immediately when the zero voltage point is reached.

According to the invention there is provided a switching system for sequential connection of a plurality of loads to an alternating current supply, said system comprising a plurality of switch devices for connecting respective ones of said loads to said supply and a circuit arrangement for providing a plurality of control signals in a predetermined sequence, said switch devices being responsive to selected numbers of said control signals to effect sequential connection of said loads to said supply, the system also including an apparatus for inhibiting control signals to each switch except when the supply voltage which is controlled by that switch device is adjacent zero volts, and apparatus for causing each successive control signal to be applied to connect a load to the supply before disconnection of a previous load from the supply.

In a particular embodiment said switching system is intended for a three phase supply and comprises three switch devices for each load.

Figure 2:
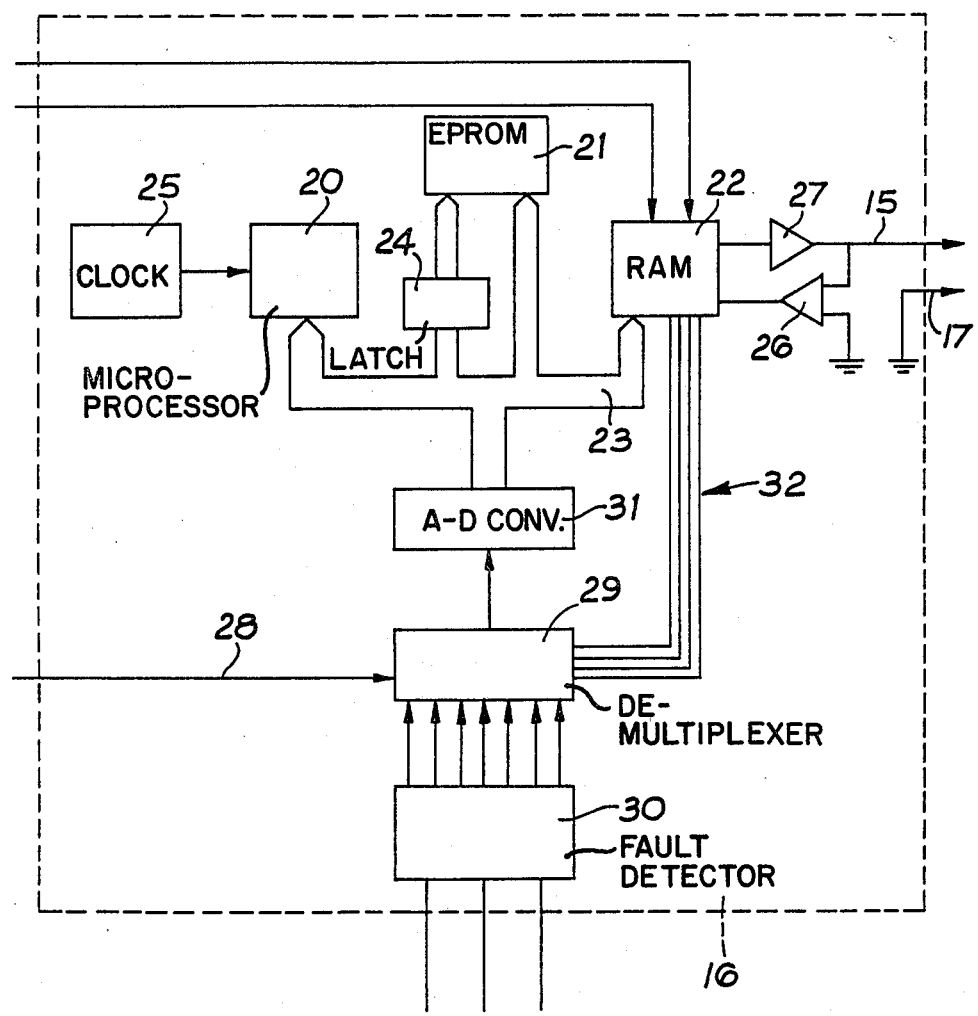
Figure 3:
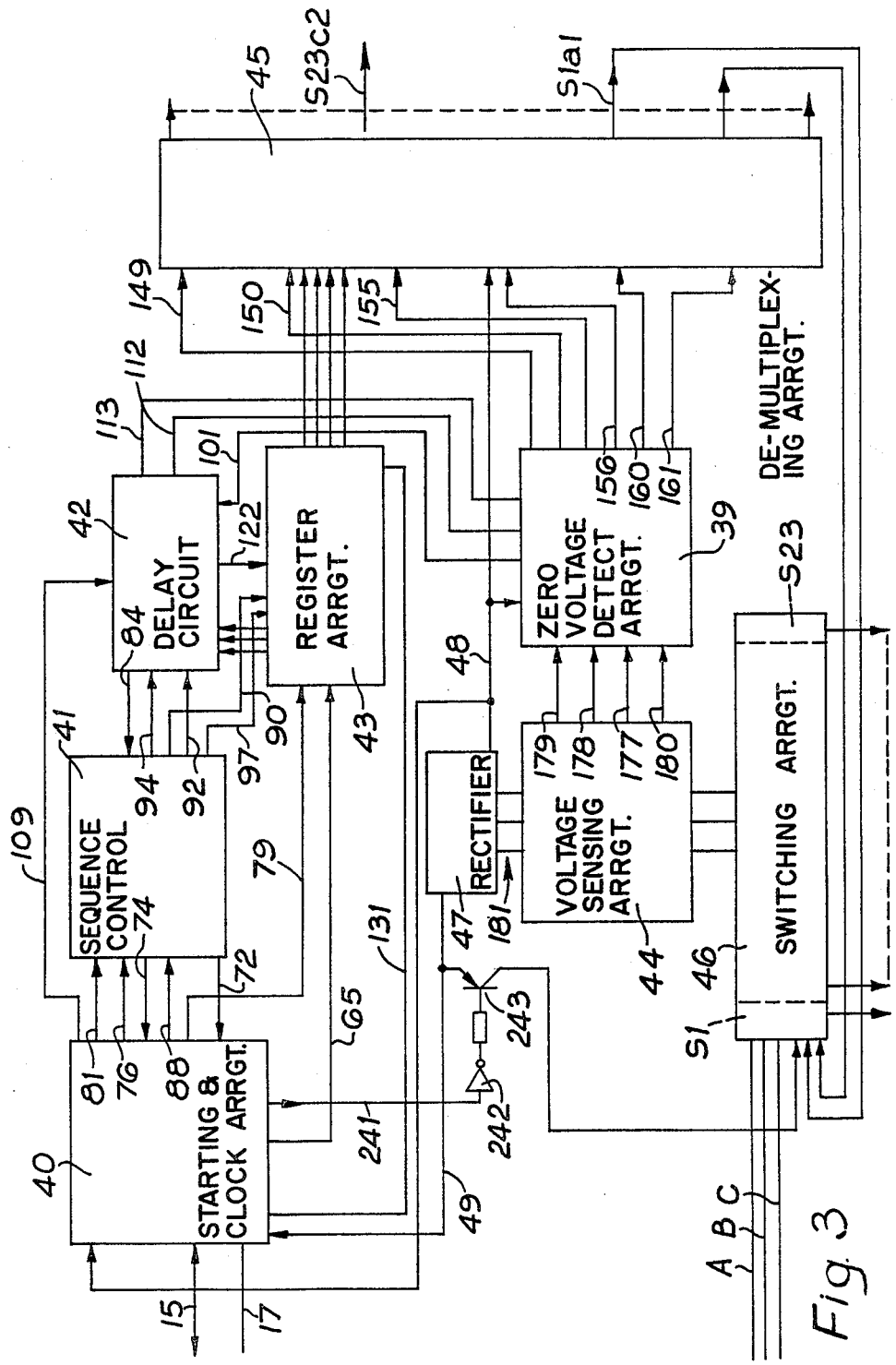
Figure 7:
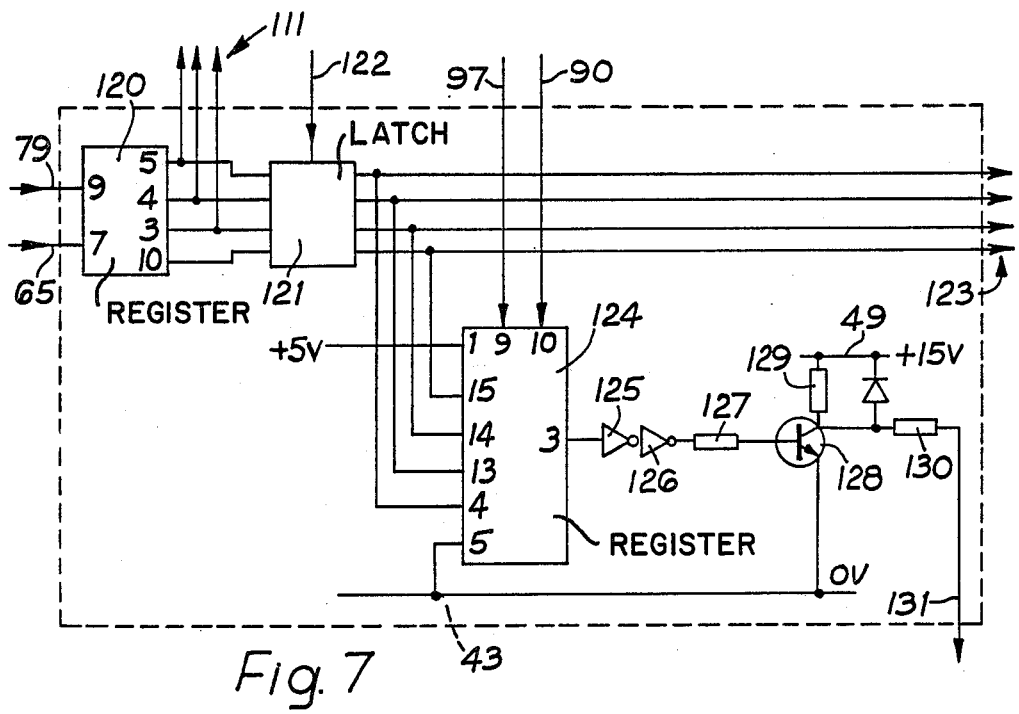
Figure 8:
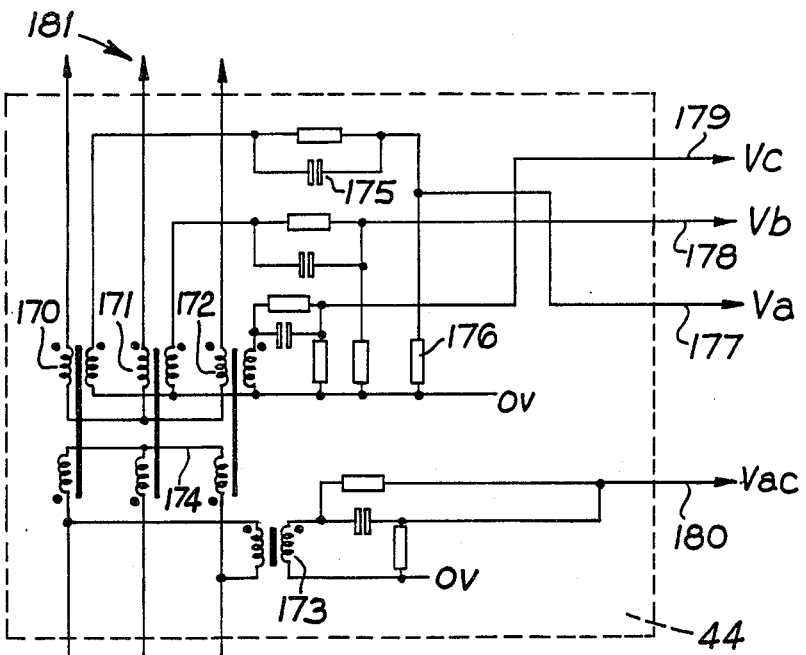
Figure 9:
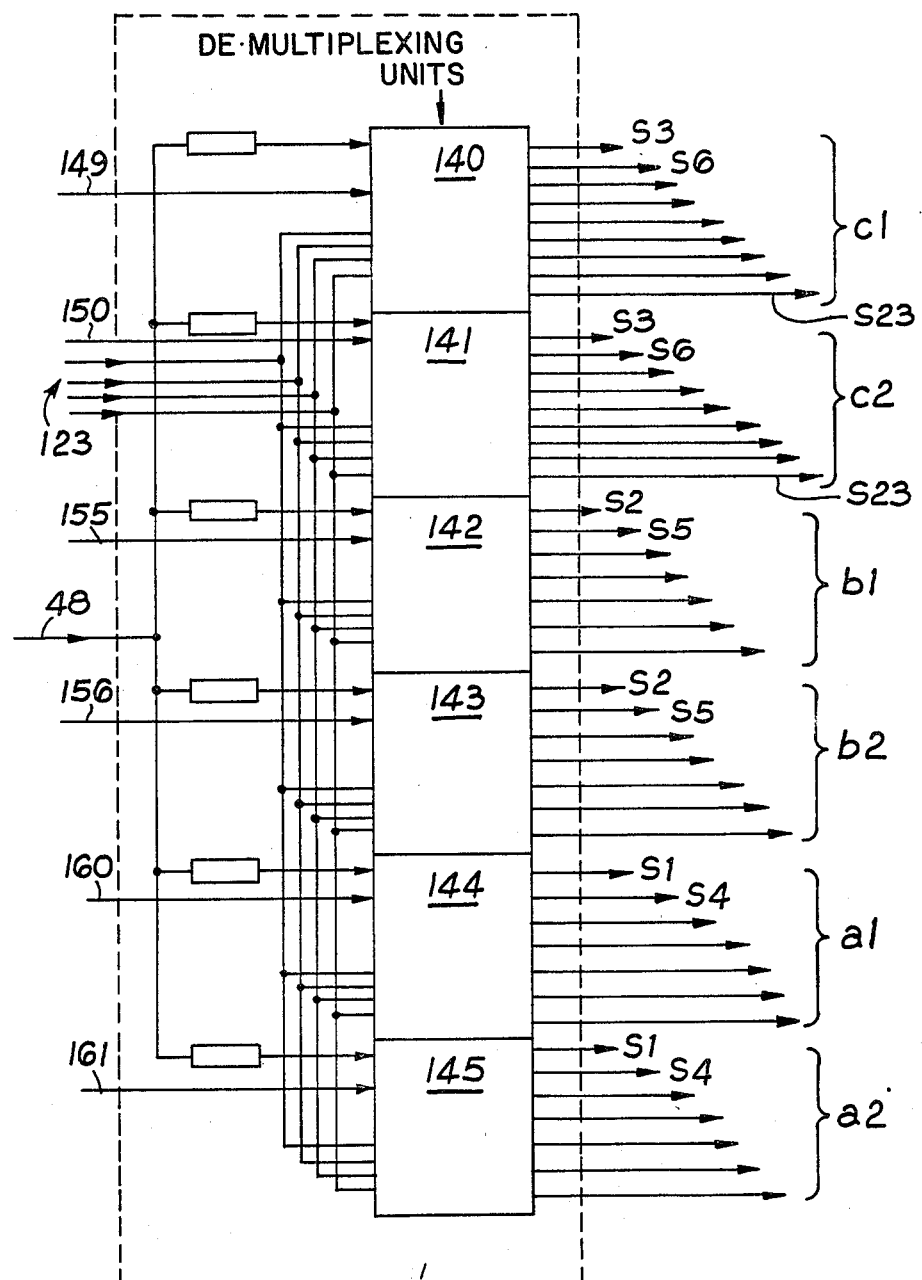
Figure 13:
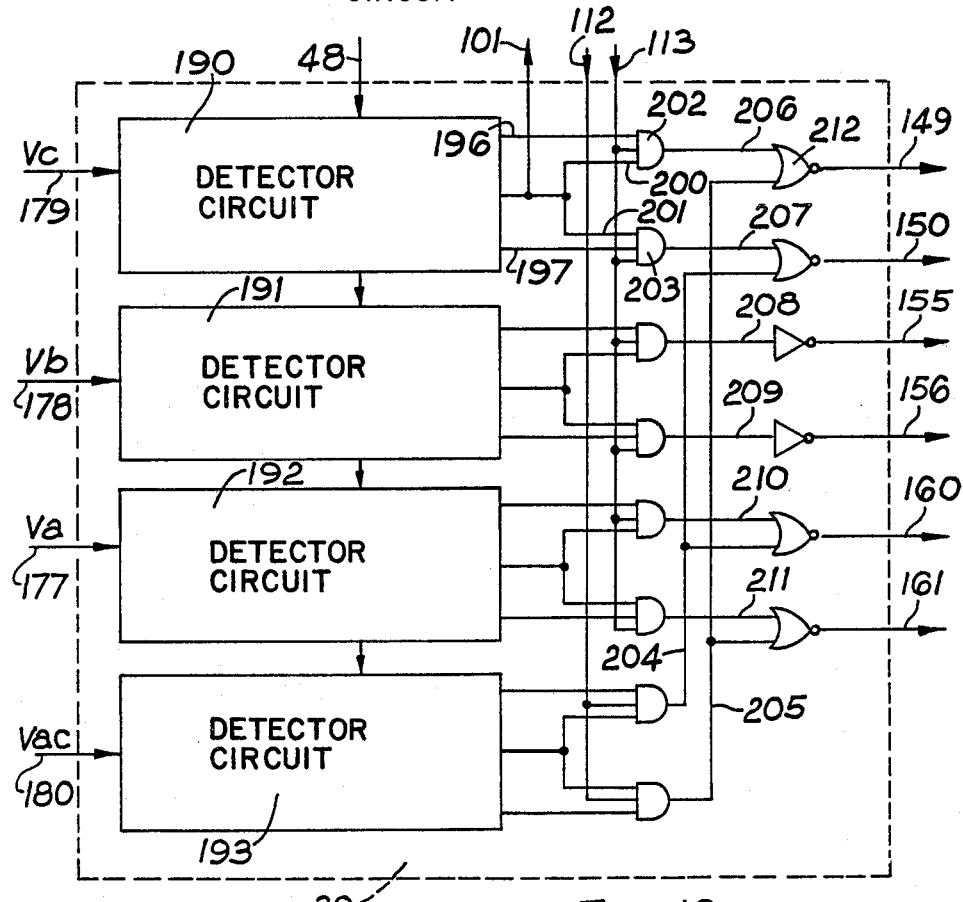
Figure 14:
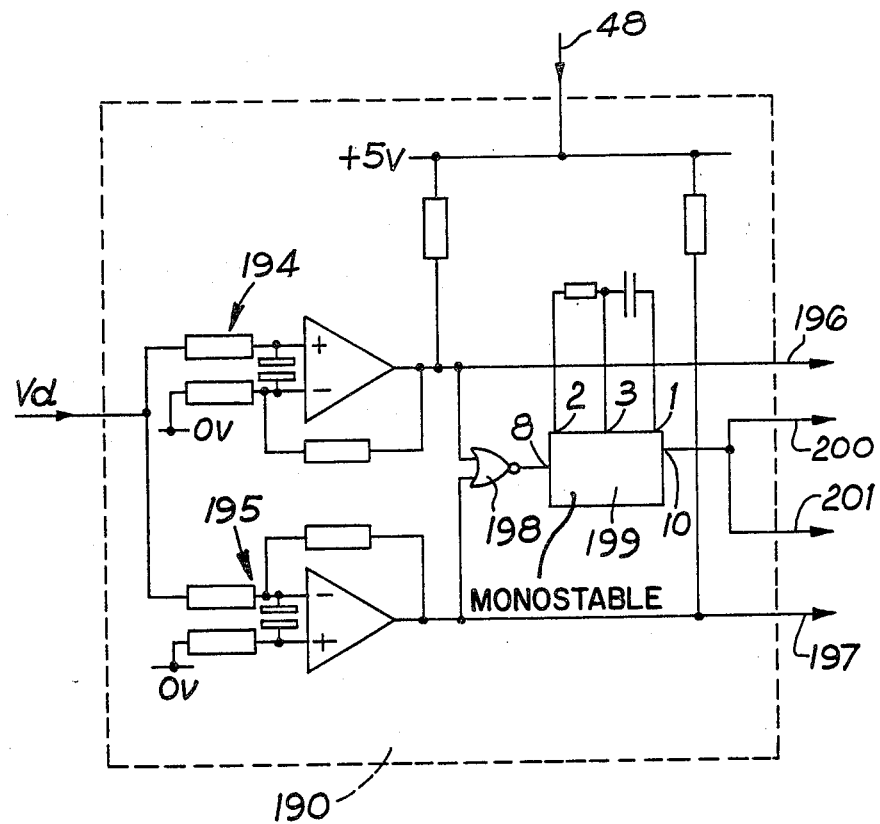
Figure 15:
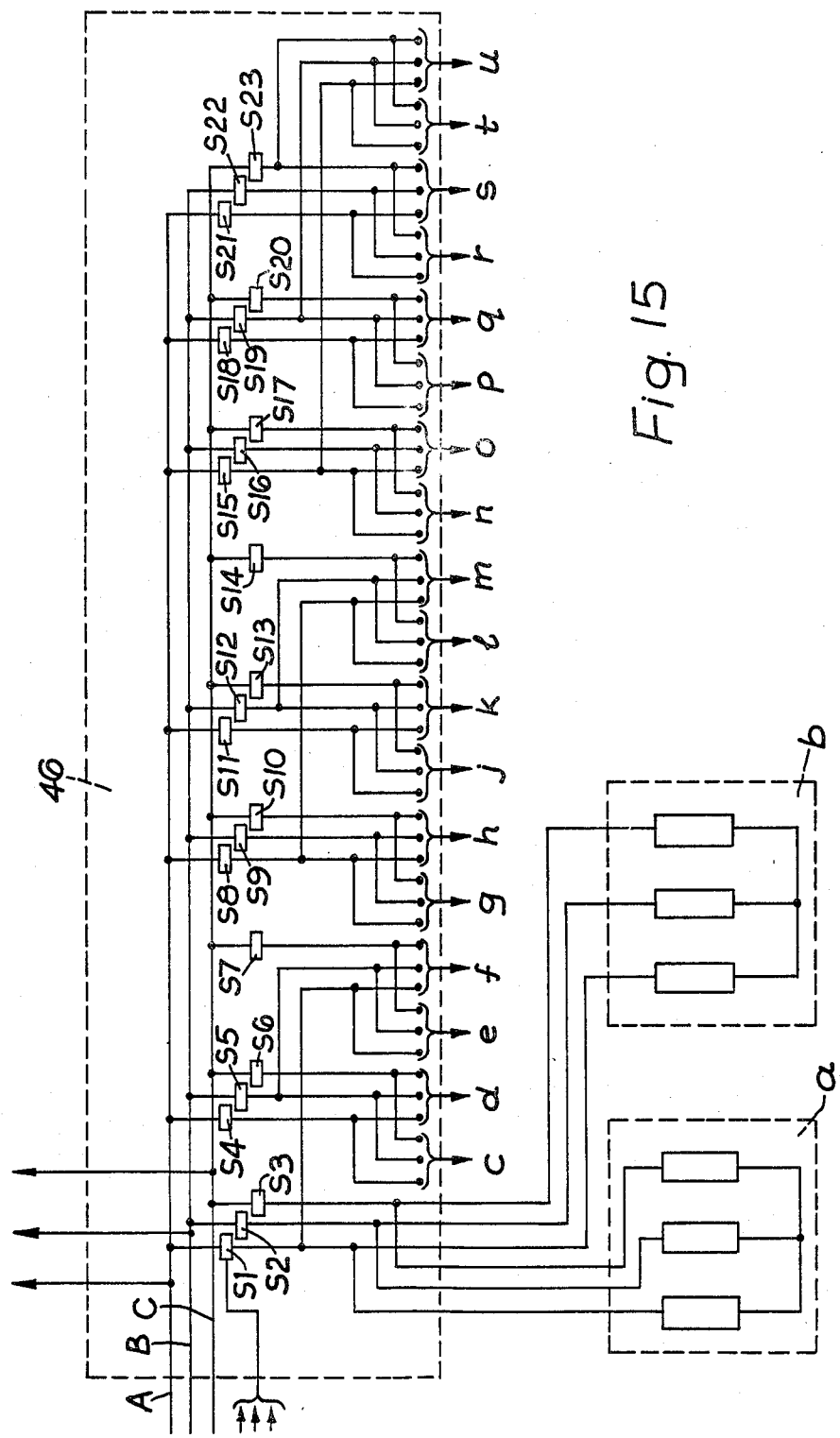
Figure 16:
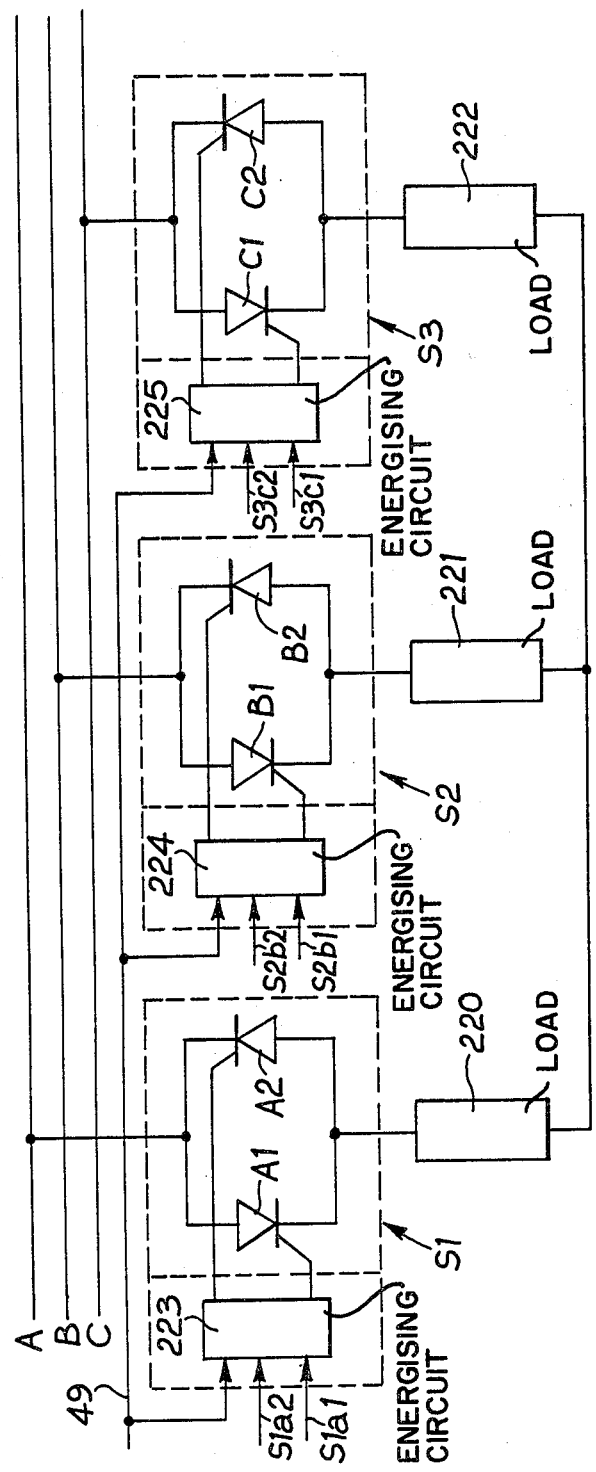
Figure 17:
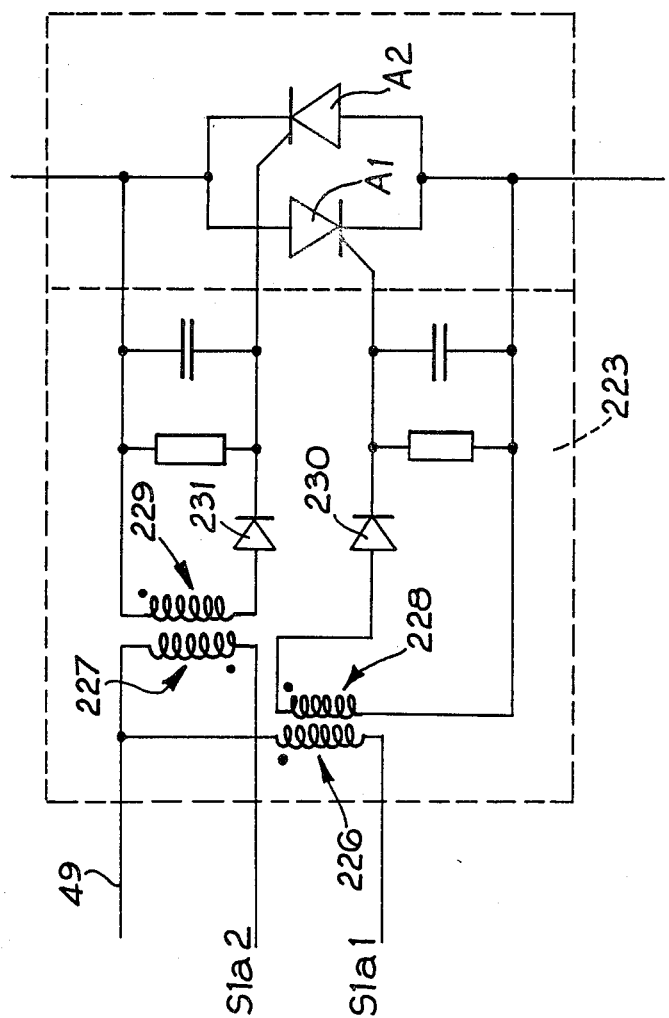
Figure 18:
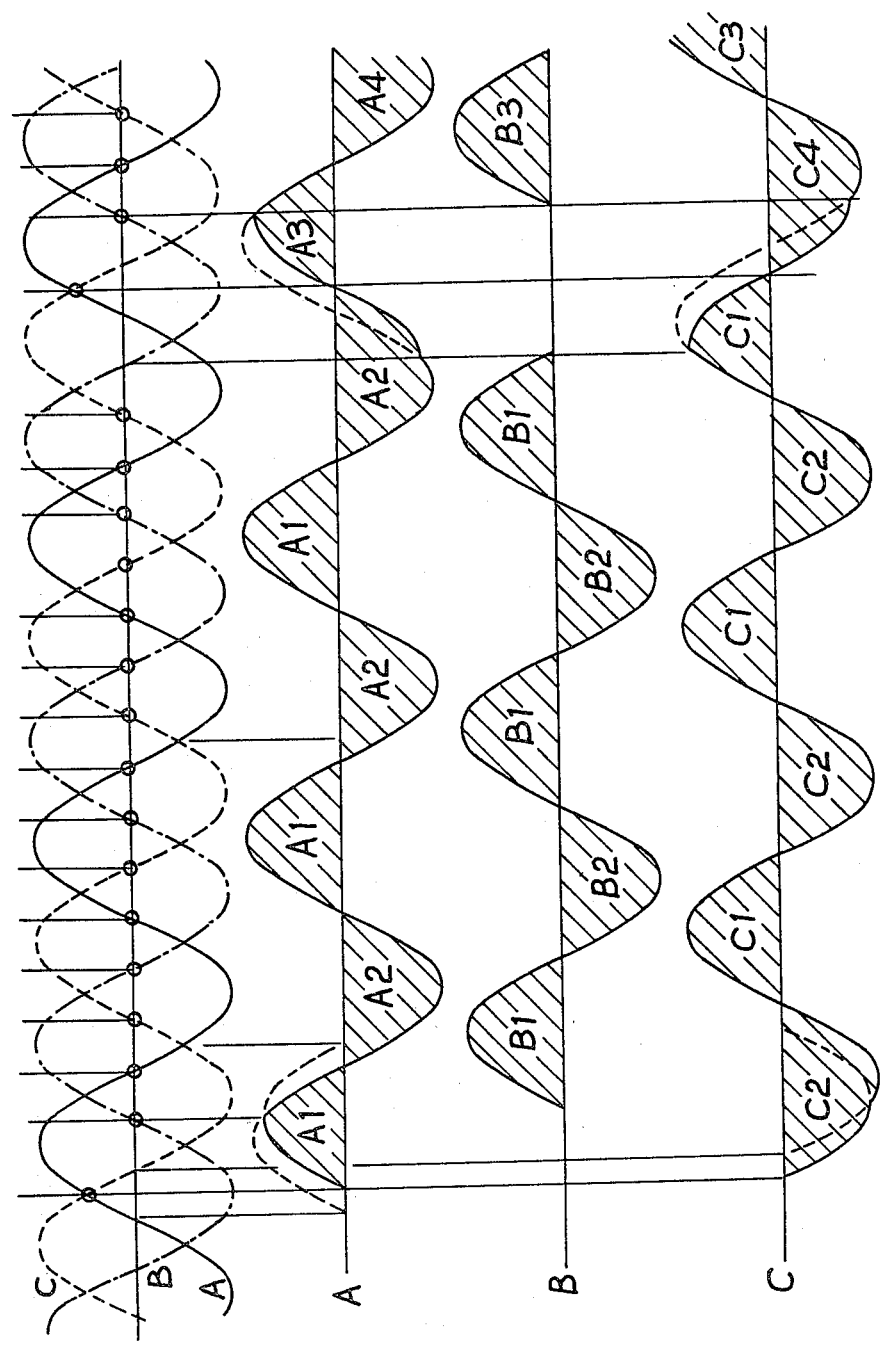
Figure 19:
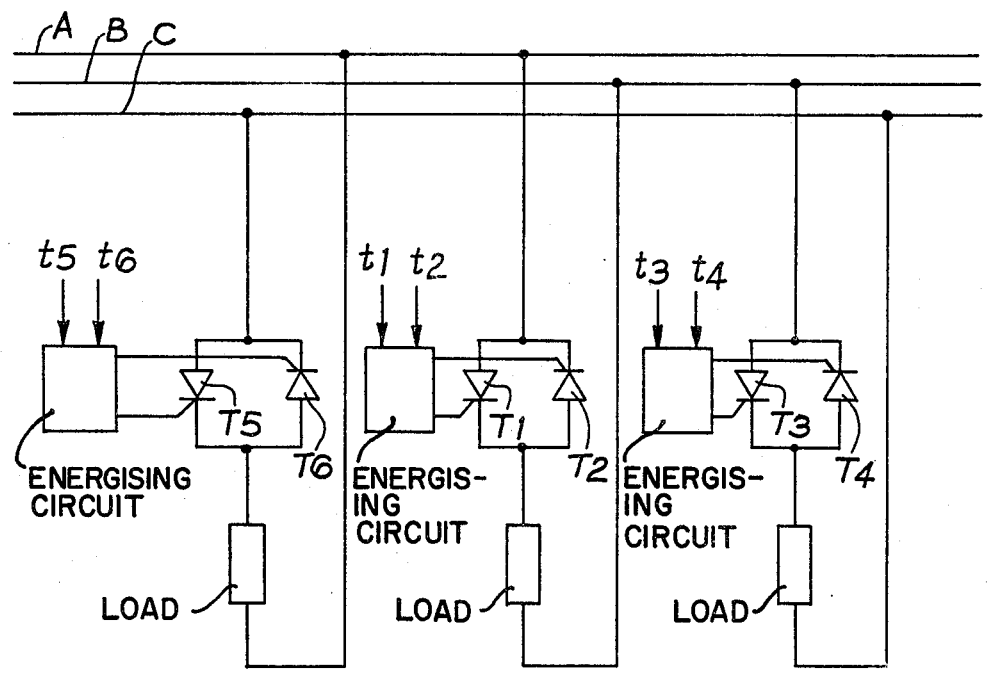
Figure 20:
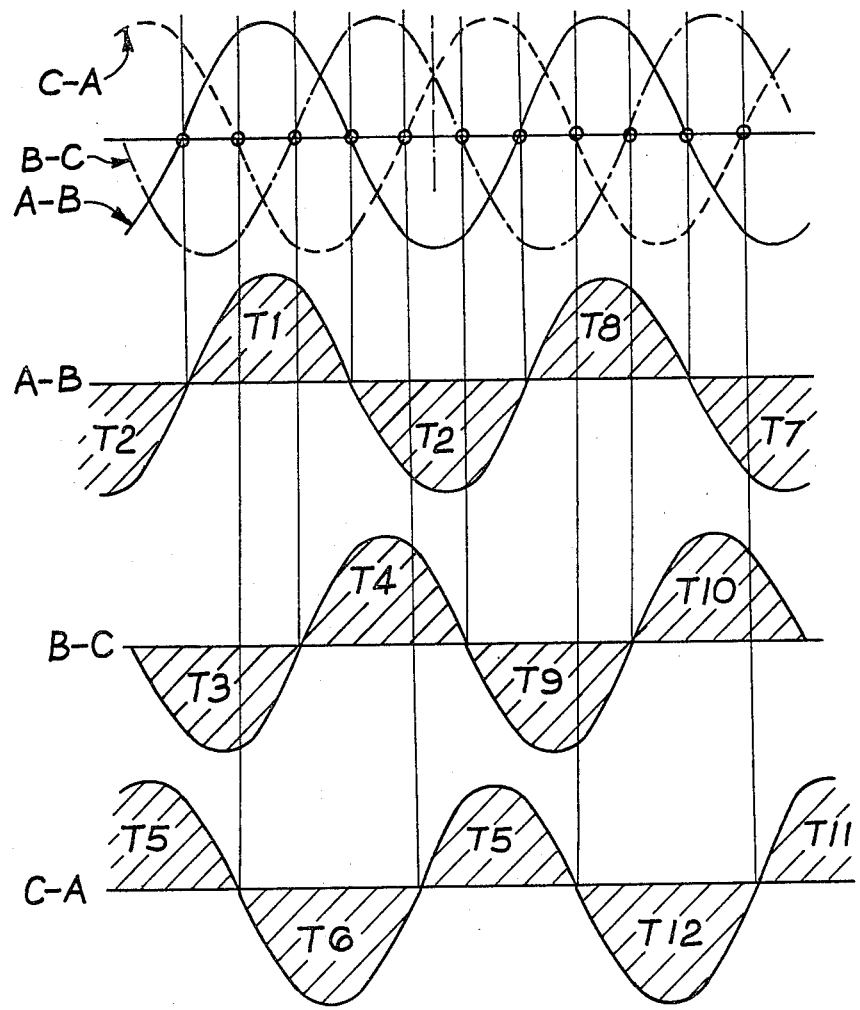
Figure 21:
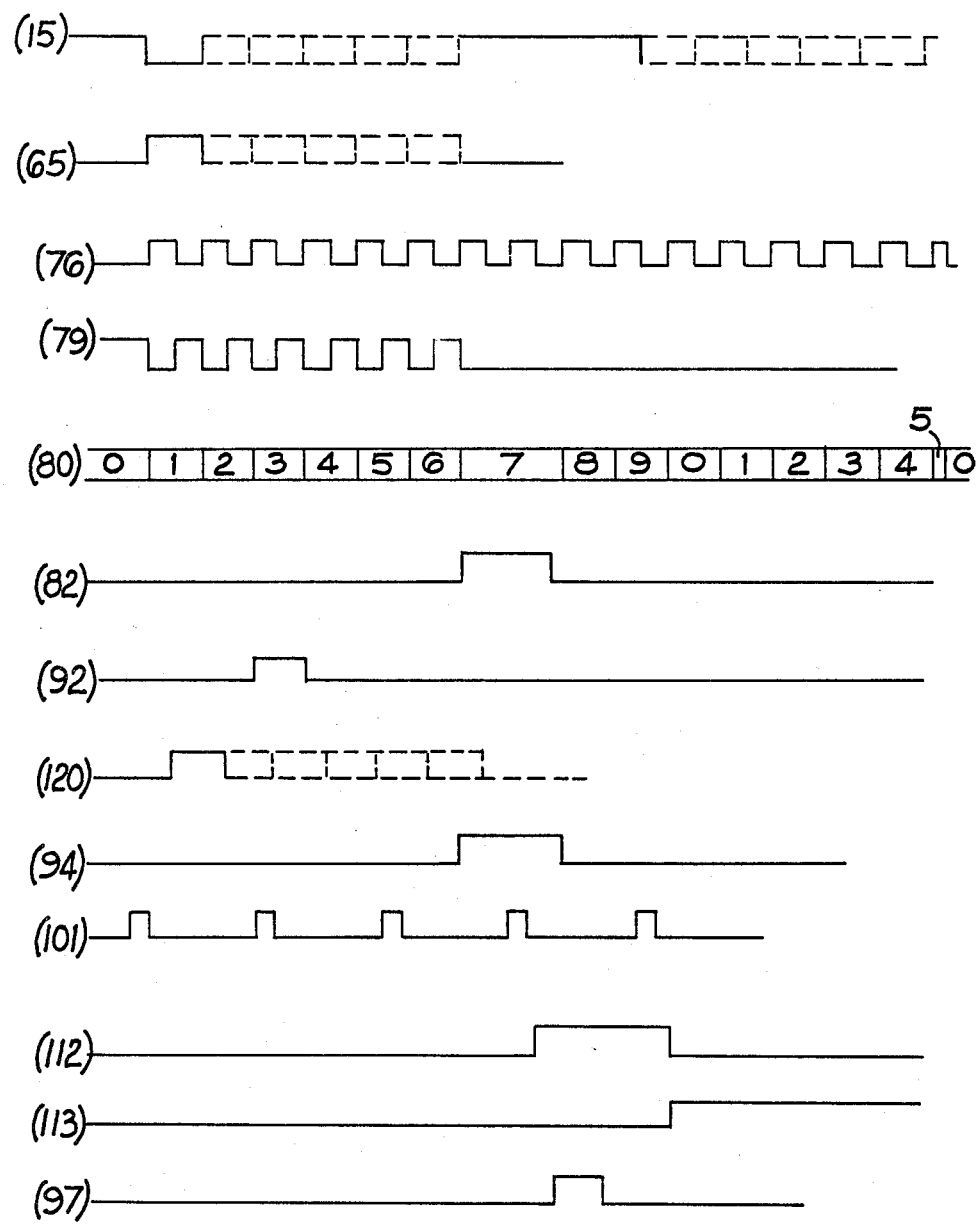
Figure 23:
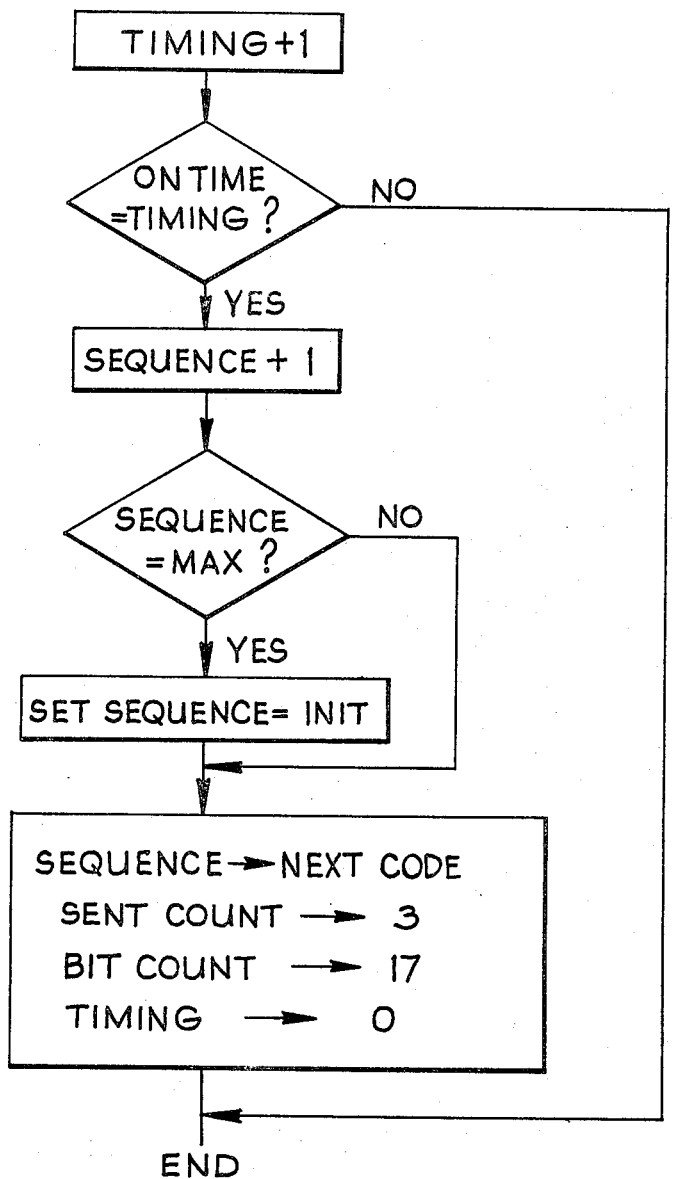
Figure 24:
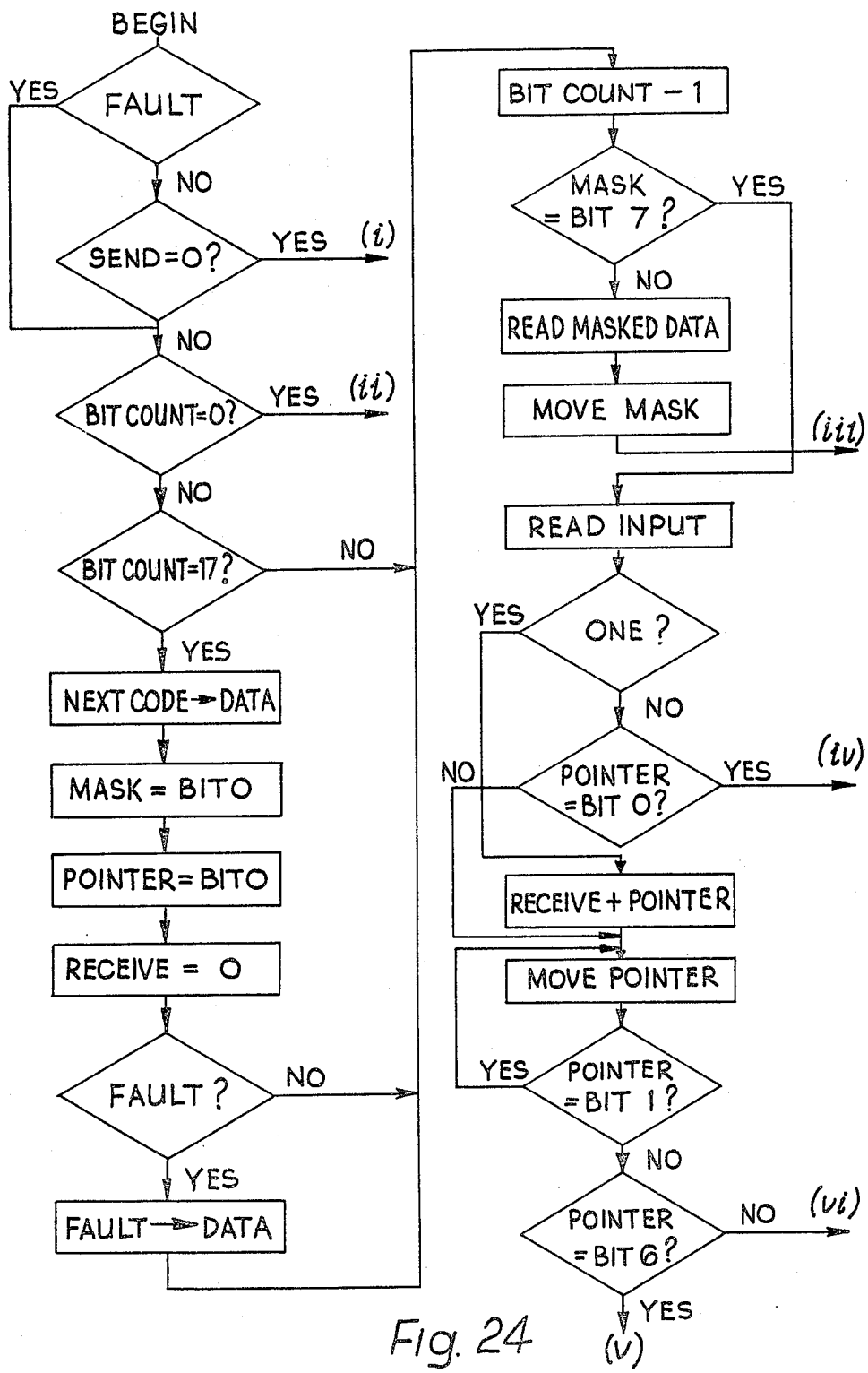
Figure 25:
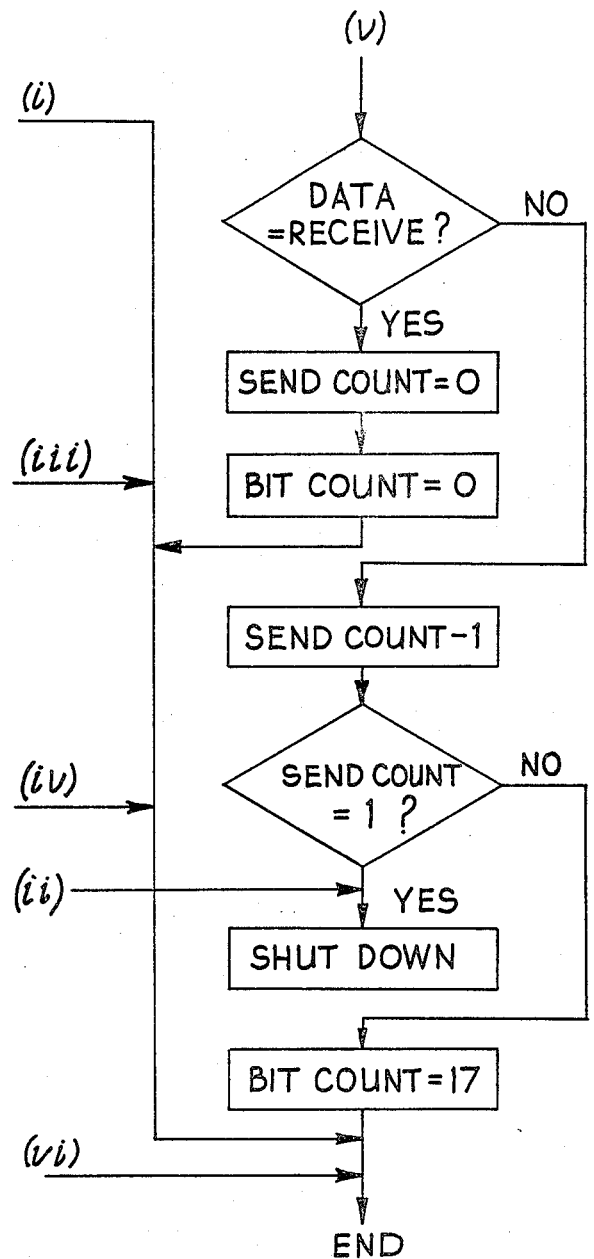

Embodiments of the invention will not be described by way of example only and with reference to the accompanying drawings in which:

FIG. 1 shows, diagrammatically, a de-icing system for the blades of a helicopter rotor, FIG. 2 is a block diagram of a digital computer forming part of the system of FIG. 1, FIG. 3 is a block diagram of a distributor arrangement forming part of the system of FIG. 1, FIGS. 4, 5, 6, 7 and 8 are circuits forming part of the distributor arrangement of FIG. 3, FIG. 9 is a block diagram of a demultiplexer forming part of the distributor arrangement of FIG. 3, FIGS. 10, 11 and 12 are details of the demultiplexer of FIG. 9, FIG. 13 is a diagram of a zero-voltage signal generator forming part of the distributor arrangement of FIG. 3, FIG. 14 is a detail of part of the signal generator of FIG. 13, FIG. 15 is a diagram of a plurality of switch means forming part of the distributor arrangement of FIG. 3, FIG. 16 shows, in more detail, one of the switch means of FIG. 15, FIG. 17 shows one of the control circuits forming part of the switch means of FIG. 16, FIG. 18 shows the relationship between the supply voltages and successive operation of the switch means of FIG. 16, FIG. 19 corresponds to FIG. 16 and shows an alternative arrangement with the loads connected in delta, FIG. 20 shows the relationship between the supply voltages and successive operation of the switch means of FIG. 19, FIG. 21 shows the time relationship of signals at various parts of the distributor arrangement of FIG. 3, FIG. 22 is a truth table for switch inhibiting signals in the distributor arrangements, and FIGS. 23 to 25 are flow charts indicating the steps in generation of control data by the computer of FIG. 2.

As shown in FIG. 1 the four blades 10 of the main rotor of a helicopter are provided with heaters 11 for de-icing. The heaters 11 each comprise three resistor elements arranged in star. For the purposes of clarity in FIG. 1 only one heater 11 is shown on each of the blades 10, but as will be made clear hereafter, each of the blades 10 is provided with five such heaters.

An electric generator 12 provides a three phase output of 115 volts at 400 Hz on each of three lines A, B, C, which communicate with a distributor arrangement 13 through slip rings 14, the distributor arrangement 13 rotating with the blades 10. The distributor arrangement 13 is responsive to signals on a line 15 from a microcomputer 16, communication with the computer 16 also being by way of the slip rings indicated at 14. A 0 volts reference line 17 also interconnects the distributor arrangement 13 and computer 16 through the slip rings 14.

The computer 16 is responsive to voltage and current conditions in the lines A, B, C, to signals from an outside air temperature sensor 18 and to signals from an ice detector 19. The sensor 18 is a constantly-energised, temperature responsive platinum resistor element. The computer 16 is shown as a block diagram in FIG. 2 and includes an INTEL 8085 Type microprocessor 20, an INTEL 2716 EPROM 21 having a 2K capacity and an INTEL 8155 random access memory (RAM) 22. The RAM 22 includes a plurality of input/output ports for the computer 16 and communicates with the microprocessor 20 through data and address buses indicated at 23. The EPROM 21 communicates with the address lines of the buses 23 through an INTEL 8212 eight-bit latch 24. A 3 MHz clock 25 controls the computer 16 and includes a dividedown circuit which provides real-time pulses at 0.5 millisecond intervals for controlling sampling of the input information, and provision of de-icing control data to the distributor arrangement 13. The RAM 22 communicates with the distributor arrangement 13 through input/output amplifiers 26, 27 the line 15 and the slip rings 14.

The ice detector 19 provides a digital input directly to the RAM 22 through its input/output ports when icing conditions are likely to be present. The outside air temperature sensor 18 provides an analog signal on a line 28 to an analog de-multiplexing circuit 29 within the computer 16. Fault detector circuits 30 are responsive to the lowest voltage on any of the lines A, B, C, the earth current in these lines, the line current in these lines and the highest line current. These signals are sampled on a time basis under control of signals on lines 32 from the RAM 22, and are passed to an analog to digital converter 31 and thence via the buses 23 to the RAM 22.

As described more fully hereafter the control program for the computer 16 is contained within the EPROM and is responsive to the system inputs to supply control signals to the distributor arrangement 13, these signals being a series of bits of 0.05 millisecond duration on the line 15, as explained in more detail hereafter. The computer 16 is also responsive to signals returned on the line 15 from the distributor 13, so that an indication of malfunction causes a shut down which will minimise or prevent damage due to malfunction. Since transfer of the voltage supply between the heater loads on the blades 10 occurs at intervals of several seconds and since the return signals on the line 15 need to be examined once only in each switching operation, the amount of time taken for the high priority interrupt is an insignificant percentage of the total computer operating time. Computer time which is not occupied by transmission of signals on line 15, by the generation of these signals, or by sampling of the fault detector circuits 30 is used to carry out a self-test program which includes a read and write check on the RAM 22 to varify correct data storage and a parity or checksum check carried out on the EPROM 21. Checks on the operation of the analog to digital converter 31 and de-multiplexer 29 are also carried out.

The signals from the computer 16 on the line 15 are used by the distributor arrangement 13 to address selected switches therein at appropriate times of the voltage cycles on lines A, B, C. The distributor arrangement 13 is shown as a block diagram in FIG. 3 and in more detail in FIGS. 4 to 17. FIGS. 3 to 17 should be read in conjunction, corresponding elements having been allocated identical reference numerals.

As shown in FIG. 3 the distributor arrangement 13 includes a starting and clock arrangement 40 (FIG. 4), a sequence control arrangement 41 (FIG. 5) a delay circuit 42 (FIG. 6), a register arrangement 43 (FIG. 7), a voltage sensing arrangement 44 (FIG. 8), a de-multiplexing arrangement 45 (FIG. 9), a zero voltage detection arrangement 39 (FIG. 13), a switching arrangement 46 (FIG. 15) and a rectifier circuit 47. The rectifier circuit 47 is responsive to the voltages on the lines A, B, C, to provide five volts on a line 48 and fifteen volts on a line 49.

Figure 4:
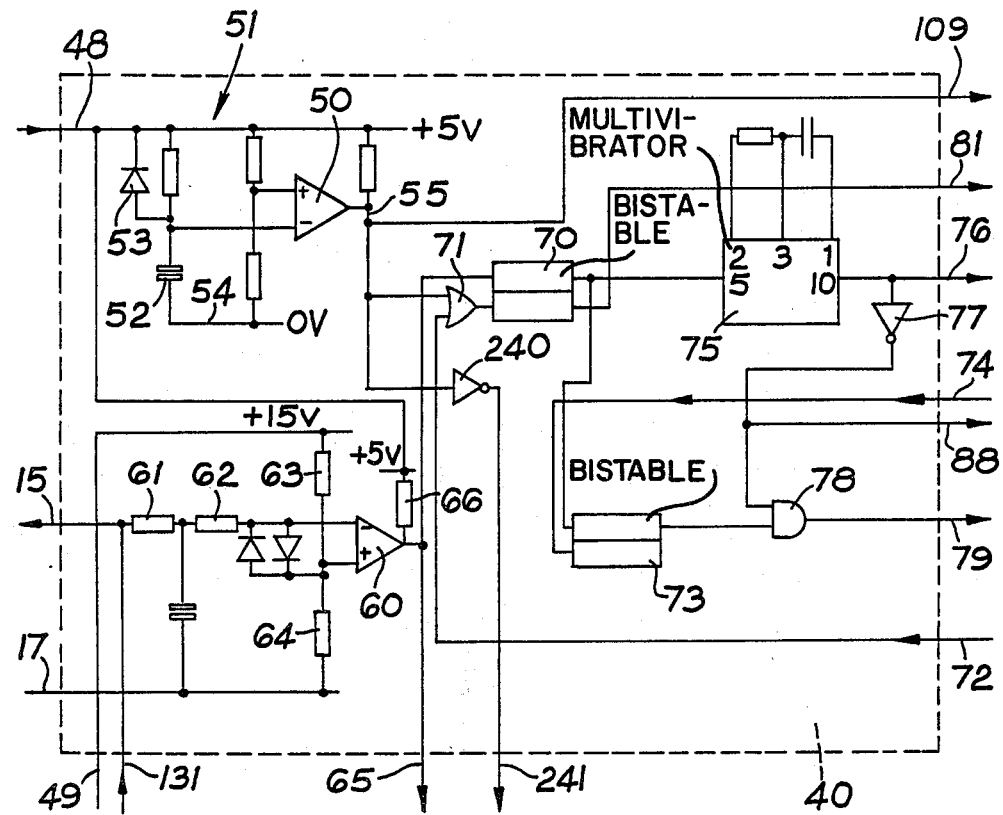

As shown in FIG. 4 the arrangement 40 includes an amplifier 50, a resistor network, indicated at 51, a capacitor 52 and a diode 53, which are connected between the five volt line 48 and a 0 volt rail 54. The arrangement is such that when power is applied to the lines A, B, C, the resulting five volts on the line 48 produces a high level resetting pulse at the output of the amplifier 50, on a line 55.

A further amplifier 60 has its inverting input connected to the line 15 from the computer 16, through resistor 61, 62 and its non-inverting input connected to the 15 volt line 49 through a resistor 63 and to the 0 volt reference line 17 through a resistor 64. The output of the amplifier 60 is connected to a line 65 and also to the five volt line 48 through a resistor 66. The computer 16 is arranged so that a fifteen volt level on the line 15 corresponds to logic 0, and a 0 volt signal on the line 15 corresponds to logic 1. The amplifier 60 inverts the signals on the line 15 to provide, on the line 65 a high level signal corresponding to logic 1 and a low level signal corresponding to logic 0.

The line 65 is connected to the SET input of a bistable device 70. The line 55 from the amplifier 50 is connected to one input of an OR gate 71 whose other input is connected to a line 72. The output of the OR gate 71 is connected to the RESET input of the device 70. The device 70 is such that it provides high level signals at its SET and RESET outputs only in response to high level signals at the SET and RESET inputs respectively.

The SET output of the bistable device 70 is connected to the SET input of an identical bistable device 73 whose RESET input is connected to a line 74 from the sequence control arrangement 41. The SET output of bistable device 70 is also connected to terminal 5 of an RCA-CD 4047B multivibrator 75. A resistor and capacitor are connected to the timing terminals 1, 2, 3 of the multivibrator 75 so that, in response to a high level signal at its terminal 5, the multivibrator provides, at its terminal 10, a square wave pulse train whose mark/space ratio is unity and whose cycle time is 0.5 milliseconds. The multivibrator 75 thus acts as a clock for the distributor arrangement 13 and has a frequency which is equal to that of the divided down real time clock frequency of the computer 16. The clock signals from terminal 10 of the multivibrator 75 are supplied on a line 76 to the sequence control arrangement 41 and also through an inverter 77 to one input of an AND gate 78 whose other input is connected to the SET output of the bistable device 73. The output of the AND gate 78 is connected by a line 79 to the register arrangement 43.

Figure 5:
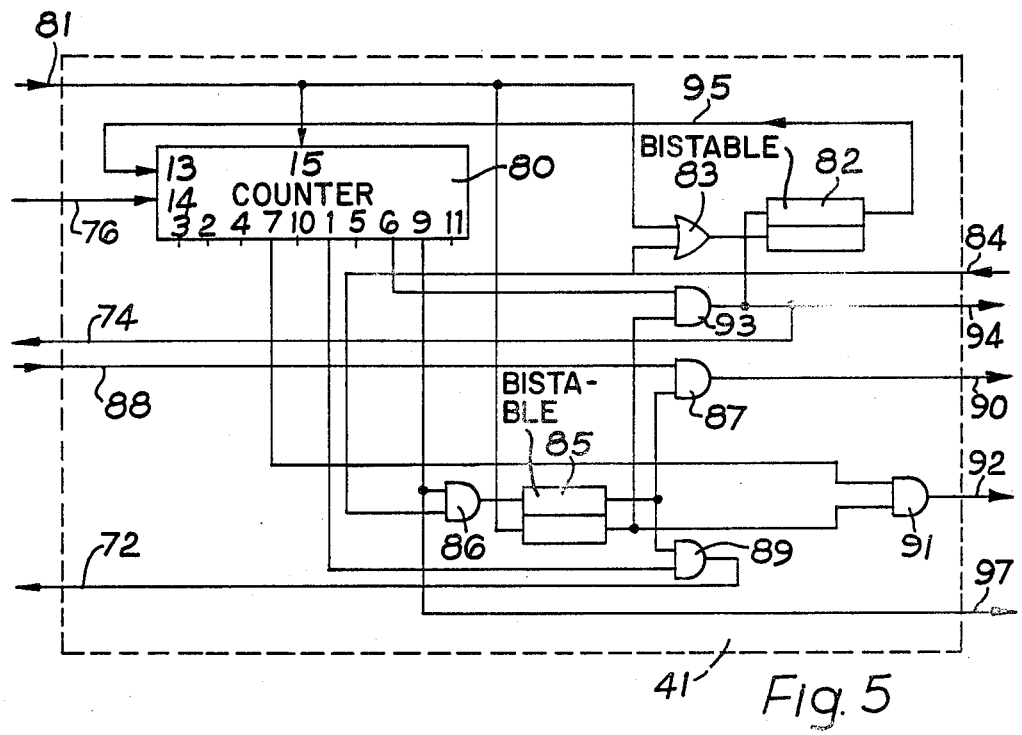
Figure 6:
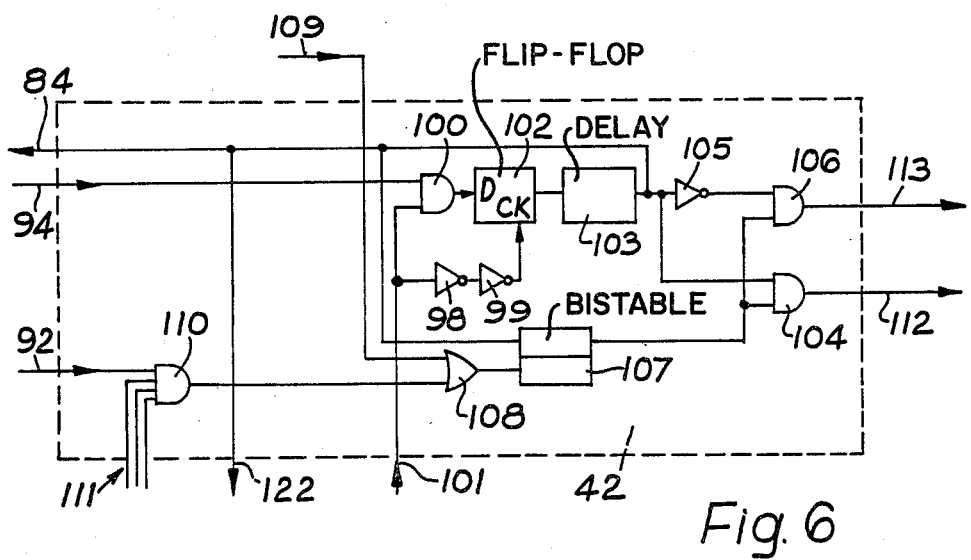

As shown in FIG. 5 the sequence control arrangement 41 includes a RCA-CD 4017B decade counter 80 whose clock input terminal 14 is connected to the line 76 from the multivibrator 75. The reset terminal 15 of the counter 80 is connected by a line 81 with the RESET output of the device 70 in the circuit 40 (FIG. 4). The clock inhibit terminal 13 of the counter 80 is connected by a line 95 to the SET output of a bistable device 82 which is identical with the devices 70, 73 previously described. After being reset by a pulse on the line 81, and in the absence of a signal on the line 95, the counter 80 is responsive to clock pulses at its terminal 14 to provide successive output signals at its terminals 2, 4, 7, 10, 1, 5, 6, 9 and 11, indicative of count values of 1,2, 3, 4, 5, 6, 7, 8 and 9 respectively. The line 81 also communicates with one input of an OR gate 83 whose output is connected to the RESET input of the device 82 and whose other input is connected to a line 84 from the delay circuit 42. The line 81 also communicates with the RESET input of a fourth bistable device 85, identical with the devices 70, 73, 82. The line 84 communicates with one input of an AND gate 86 whose other input is connected to terminal 9 of the counter 80. Terminal 9 of the counter 80 is also connected by a line 97 to the register arrangement 43 (FIG. 7). The output of the gate 86 is connected to the SET input of the bistable device 85. The SET output of device 85 is connected to one input each of two AND gates 87, 89. The other input of gate 87 is connected by a line 88 to the output of the inverter 77 in the circuit 40 (FIG. 4). The other input of gate 89 is connected to terminal 1 of the counter 80 and its output is connected through the line 72 to one input of the OR gate 71 in the circuit 40. The output of gate 87 is connected through a line 90 with the register arrangement 43. The RESET output of the device 85 is connected to one input of an AND gate 91 whose other input is connected to terminal 7 of the counter 80. The output of the gate 91 is connected through a line 92 to the delay circuit 42 (FIG. 6). The RESET output of the device 85 is also connected to one input of an AND gate 93 whose other input is connected to terminal 6 of the counter 80 and whose output is connected through the line 74 to the RESET input of the device 73 in the circuit 40, (FIG. 4). The output of the gate 93 is also connected to the SET input of the device 82 and, through a line 94, with the delay circuit 42 (FIG. 6).

As shown in FIG. 6 the circuit 42 includes an AND gate 100, one of whose inputs is connected to the line 94 and the other of whose inputs is connected to a line 101 from the zero voltage detection arrangement 39 (FIG. 13). The output of gate 100 is connected to the D input of a D type flip-flop 102, and the line 101 is also connected to the clock input CK of the flip-flop 102 through two inverters 98, 99 the inverters 98, 99 provide a small delay which ensures that the flip-flop 102 is not clocked in advance of an output signal from the gate 100. The output from the flip-flop 102 is applied to a 0.2 millisecond delay device 103 whose output is connected by the line 84 to the OR gate 83 and AND gate 86 in the sequence control arrangement 41 (FIG. 5). The output of the delay device 103 is also connected to one input of an AND gate 104 and additionally through an inverter 105 to one input of an AND gate 106. The other inputs of both of the gates 104, 106 are connected to the SET output of a bistable device 107 which is identical with the devices 70, 73, 82, 85 previously described. The SET input of the device 107 is connected to the line 84 and the RESET input is connected to the output of an OR gate 108. One input of the OR gate 108 is connected by a line 109 to the output of the resetting amplifier 50 in the starting and clock arrangement 40 (FIG. 4). The other input of the OR gate 108 is connected to the output of an AND gate 110, one of whose inputs is connected to the line 92 from the AND gate 91 in the sequence control arrangement 41 (FIG. 5). Three additional inputs of the AND gate 110 are connected by lines 111 to the register arrangement 43 (FIG. 7). The outputs of the AND gates 104, 106 are connected by respective lines 112, 113 to the zero voltage detection arrangement 79 (FIG. 13).

As shown in FIG. 7 the register arrangement 43 includes an RCA-CD-4015B serial to parallel shift register 120. The data terminal 7 of the register 120 is connected to line 65 from the output of the inverting data amplifier 60 in the starting and clock arrangement 40 (FIG. 4). The clock terminal 9 of the register 120 is connected by the line 79 to the output of the AND gate 78 in the arrangement 40. The data output terminals 5, 4, 3, 10 of the register 120 are connected to the D inputs of respective D-type flip-flops which form part of a latch device 121, all of the flip-flops being responsive to clock signals on a line 122 which is connected to the line 84 in the delay circuit 42 (FIG. 6). The data outputs from the terminals 5, 4 and 3 of the register 120 are also connected by the lines 111 to inputs of the AND gate 100 in the delay circuit 42. The outputs of the latch device 121 are connected by respective ones of four lines 123 to the de-multiplexer arrangement 45 (FIG. 9). The lines 123 are also connected to the terminals 15, 14, 13 and 4 of an RCA-CD 4014B shift register 124 which provides a serial output in response to a parallel input. Permanent inputs +5 V and 0 V are present at terminals 1 and 5 respectively of the register 124. A logic 1 signal on line 97 is applied to the parallel/serial terminal 9 of register 124 when the counter 80 reaches a count of 8. The clock terminal 10 of the register 124 is connected by the line 90 to the output of the AND gate 87 in the sequence control arrangement 41 (FIG. 5). The serial output terminal of the register 124 is connected through two inverters 125, 126 and a resistor 127 to the base of an npn transistor 128 whose emitter is connected to 0 volts and whose collector is connected through a resistor 129 to the fifteen volt line 49. The collector of transistor 128 is also connected through a resistor 130 and a line 131 to the line 15 from the computer 16, as indicated in FIG. 4.

As shown in FIG. 9 the de-multiplexing arrangement 45 comprises six de-multiplexing units 140 to 145, the units 140, 141 being identical, the units 142, 143 being identical and the units 144, 145 being identical.

Figure 10:
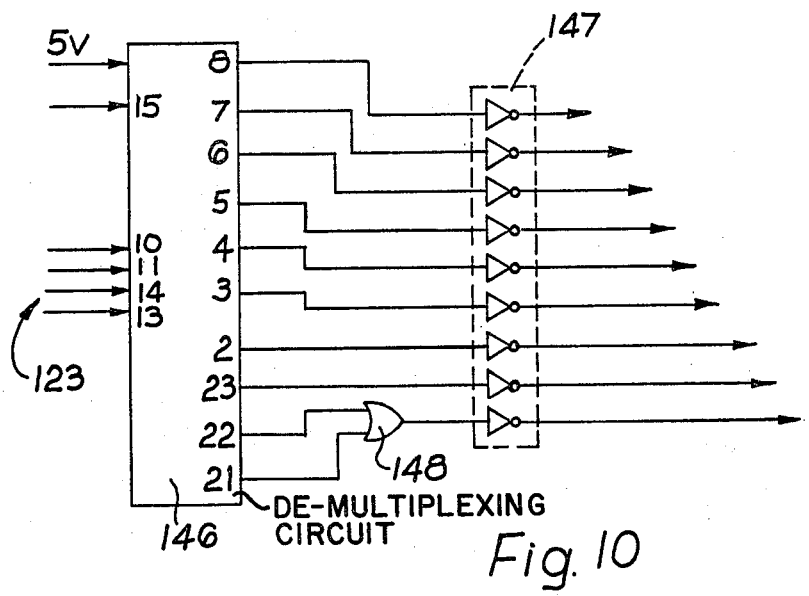

The arrangement of the units 140, 141 is shown in more detail in FIG. 10 and comprises an RCA-CD 4067B 16-channel de-multiplexing circuit 146, whose input terminals 10, 11, 14, 13 are connected to respective ones of the lines 123 from the latch device 121 in the register arrangement 43, (FIG. 7). Output terminals numbers 8, 7, 6, 5, 4, 3, 2 and 23 of the circuit 146 are connected to eight inverting amplifiers in a driver array 147. Output terminals 22 and 21 of the circuit 146 are connected to the inputs of an OR gate 148 whose output is connected to a further inverting amplifier of the driver array 147. Nine output lines from the array 147 are connected to the switching arrangement 46 (FIG. 15) in a manner later to be described. The inihibit terminal 15 of the circuit 146 in the unit 140 is connected by a line 149 (FIG. 9) to the zero voltage detection arrangement 39 (FIG. 13) and the inhibit terminal 15 of the circuit 146 in unit 141 is connected by a line 150 to the arrangement 39.

Figure 11:
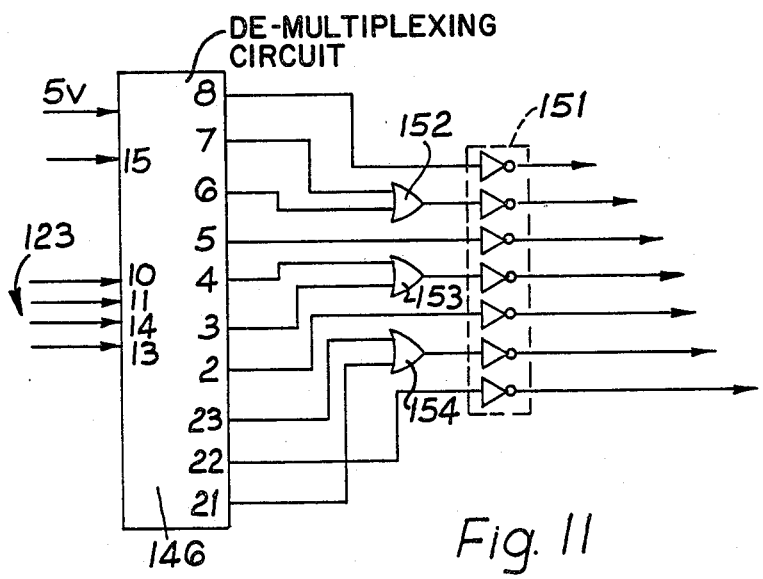
Figure 12:
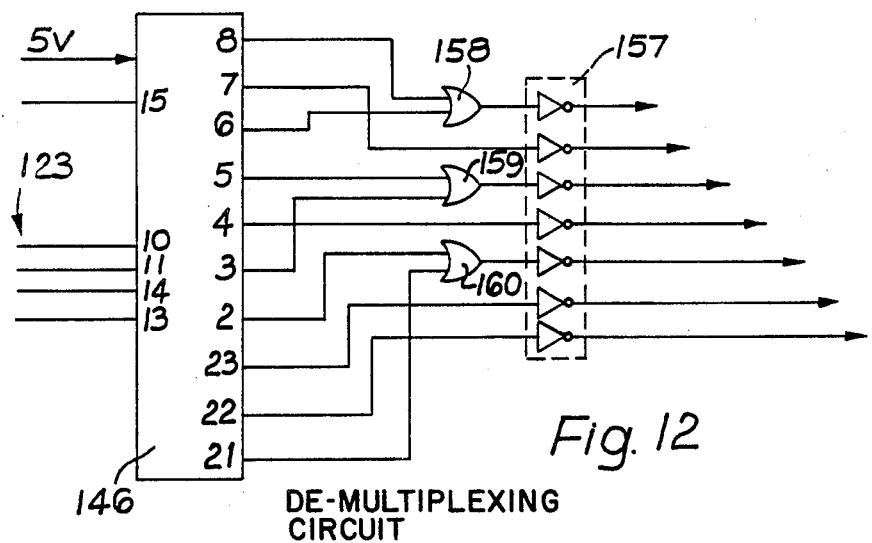

The arrangement of units 142 and 143 is shown in more detail in FIG. 11. Both of these units also include a de-multiplexing circuit 146, identical with that previously described and responsive to input signals on respective ones of the lines 123. In the case of units 142 and 143 the output terminals 8, 5, 2 and 22 of the circuit 146 are connected to respective inverting amplifiers which form part of a driver array 151. Output terminals 7 and 6 are connected to inputs of an OR gate 152, output terminals 4 and 3 to inputs of an OR gate 153 and output terminals 23 and 21 to inputs of an OR gate 154. The outputs of the gates 152, 153, 154 are connected to respective inverting amplifiers which also form part of the array 151. The inhibit terminals of the circuits 146 in the units 142, 143 are connected by respective lines 155, 156 (FIG. 9) to the zero voltage detection arrangement 39. The units 144 and 145 are shown in more detail in FIG. 12, and, again, comprise a de-multiplexing circuit 146 whose input terminals are connected to the respective lines 123. Output terminals 7, 4, 23 and 22 are connected to respective inverting amplifiers which form part of a driver array 157, terminals 8 and 6 are connected to the inputs of an OR gate 158 and terminals 5 and 3 to the inputs of an OR gate 159, and terminals 2 and 21 to the inputs of an OR gate 160. The outputs of the gates 158, 159, 160 are connected to additional inverting amplifiers which also form part of the driver array 157. The inhibit terminals 15 of the circuits 146 in the units 144 and 145 are connected by respective lines 160, 161 (FIG. 9) to the zero voltage detection arrangement 39.

As shown in FIG. 8 the voltage sensing arrangement 44 comprises four transformers 170, 171, 172, 173. The transformer 170 is responsive to the voltage between the supply line A and a neutral line 174. The current from the detected voltage is phase-advanced by a capacitor 175 and allows a phase-advanced voltage Va across a resistor 176 to be applied to a line 177. Similar arrangements provide on a line 178, a phase-advanced detected voltage Vb corresponding to that between the line B and neutral and, on a line 179 a phase-advanced detected voltage Vc corresponding to that between the line C and neutral. A phase-advanced detected voltage Vac corresponding to that between the lines A and C is supplied on a line 180. Additional windings on the transformers 170, 171, 172 provide supplies on lines 181 to the rectifier circuit 47 (FIG. 3).

As shown in FIG. 13 the zero voltage detection arrangement 39 comprises four identical detector circuits 190 to 193, one of which is shown in more detail in FIG. 14. As shown in FIG. 14 each of the detector circuits comprises two comparator circuits indicated at 194 and 195. The circuits 194, 195 have their respective non-inverting and inverting inputs responsive to one of the phase-advanced detected voltages Vd from the voltage sensing arrangement 44 (FIG. 8). The arrangement of the circuits 194, 195 is such that when the sensed voltage Vd is zero the outputs from both of these circuits are also zero. These outputs are applied to respective lines 196, 197 and are also applied to both inputs of a NOR gate 198 whose output is connected to the trigger terminal 8 of an RCA-CD 4047B monostable 199 having a timing resistor and capacitor connected to its terminals 1, 2 and 3 so as to respond to a trigger signal by producing a time pulse at its terminal 10, this time pulse being applied to lines 200, 201. If the sensed voltage Vd is positive going, the comparator circuit 194 subsequently provides a signal on the line 196. If the voltage Vd is negative going the comparator circuit 195 provides a signal on the line 197. Each of the voltages Vd is phase-advanced by approximately 7° from the corresponding zero voltage point on one of the supply lines A, B, C or from the zero voltage condition between lines A and C, as appropriate. The monostable 199 provides a pulse whose duration is approximately 22° of the corresponding voltage phase, whereby the signal at terminal 10 of the monostable 199 extends approximately 15° after the corresponding zero voltage condition.

As shown in FIG. 13 the signals on lines 196, 197, 200 and 201 are supplied to a pair of AND gates 202, 203. The AND gate 202 will thus provide an output signal only when the sensed voltage Vc is positive-going, and the gate 203 provides an output signal only when voltage Vc is negative-going. The corresponding AND gates associated with the detector circuits 191, 192, 193 provide output signals, only when their sensed voltage inputs Vb, Va and Vac are respectively positive-going and negative-going.

The AND gates 202, 203 associated with the detector circuits 190, 191, 192 are also responsive to signals on the line 113 from the AND gate 106 in the delay circuit 42 (FIG. 6). The AND gates associated with the detector circuit 193 are also responsive to signals on the line 112 from the AND gate 104 in the delay circuit 42.

The arrangement is such that, in the presence of a signal on line 112, high level, phase-advanced and time-extended indicating signals are present on the respective lines 204, 205 when the voltage Vac between supply lines A, C, is adjacent zero and is respectively positive-going and negative-going. Similarly, in the presence of a signal on line 113, phase-advanced, time-extended indicating signals are provided on lines 206, 207 when voltage Vc is adjacent zero and is respectively positive-going and negative-going, on lines 208, 209 when voltage Vb is adjacent zero and is respectively positive-going and negative-going, and on lines 210, 211 when voltage Va is zero and is respectively positive-going and negative going. A NOR gate 212 is responsive to the indicating signals on lines 205, 206 to provide an inhibiting signal I on the line 149 except in the presence of a signal on line 205 or line 206. A truth table for the inhibiting signals on lines 149, as well as on lines 150, 155,156,160 and 161 is shown in FIG. 22. In this table the top row indicates the several conditions of the detected supply voltages, as well as the presence of a logic 1 on the line 112 or line 113. Successive rows show the combinations of the above conditions which will result in the inhibit signals I becoming logic 1.

The line 101 connects the output of the monostable 199 (see FIG. 14) in the detector circuit 190 (FIG. 13) to one input of the AND gate 100 in the delay circuit 42 (FIG. 6), as previously described.

Each of the four helicopter blades 10 (FIG. 1) has five heaters, and each heater comprises three resistive loads in star connection. Two of these heaters a, b, are indicated in FIG. 15 which shows the layout of the switching arrangement 46. Connections from the switching arrangement 46 to the remaining 18 heaters c,d,e,f,g,h,j,k,l,m,n, o,p,q,r,s,t, and u are also indicated. As shown in FIG. 15, 23 switch units S1 to S23 are used. The switches S1 to S23 are operated in groups of three, in a manner to be described, so as to connect two of the heaters a-u to the power supply lines A, B, C, at any time.

FIG. 16 shows in more detail the manner in which the heater a is connected to the supply lines A, B, C, by the switches S1, S2, S3. The switch unit S1 includes two thyristors A1, A2 which conduct oppositely flowing currents in the line A through a resistor load 220 which forms part of the heater a. Switch S2 comprises thyristors B1, B2 which conduct the respective currents in line B through a resistive load 221, and switch S3 comprises-thyristors C1, C2 for conducting respective currents in line C through a resistive load 222. The loads 220, 221, 222 are arranged in star connection as previously described. The switches S1, S2, S3 include respective identical energising circuits 223, 224, 225 the circuit 223 and the associated thyristors A1, A2 being shown in more detail in FIG. 17. The circuit 223, is responsive to low level signals S1a1 and S1a2 from the output of two of the inverting amplifiers in the driver arrays 157 of the respective de-multiplexing units 144, 145 (FIG. 9) the signals S1a1 and S1a2 being operable to render the respective thyristors A1 and A2 conductive.

As shown in FIG. 17 the circuit 223 includes a pulse transformer having a first primary winding 226 connected between the 15 volt line 49 and the S1a1 signal line and a second primary winding 227 connected between the 15 volt line 49 and the S1a2 signal line. Secondary windings 228, 229 coact with the respective primary windings 226, 227 and are connected to the gates of the respective thyristors A1, A2 through diodes 230, 231. Signals S1a1 and S1a2 thus cause the respective thyristors A1, A2 to be fired and, as will be explained hereafter, the signals S1a1 and S1a2 coincide with the phase-advanced, time-extended pulses obtained from the zero voltage crossover points on the supply line A.

Energising circuit 224 is responsive to low level signals S2b1, S2b2 which correspond to the phase-advanced, time-extended zero voltage crossover points on the supply line B. Energising circuit 225 is responsive to signals S3c1, S3c2 which similarly correspond to the zero voltage crossover points on supply line C. In addition, signals S1a1 and S3c2, or alternatively S1a2 and S3c1 are supplied, in a manner to be described, when the voltage difference between lines A and C is zero.

In use, the computer 16 is responsive to outside air temperature and to ice detection signals to generate six-bit serial data on the line 15, the first of the six-bits being a start bit for the distributor arrangement 13 and the second bit being available to provide a fault indication to the distributor. The remaining four-bits provide, in effect, address data for the heaters which are required to be energised.

When voltage is applied to the supply lines A, B, C, the rectifier circuit 47 (FIG. 3) provides 5 volts and 15 volts on the respective lines 48, 49 allowing operation of the logic and other control circuits. As described above, the 5 volt level on line 48 causes the amplifier 50 (FIG. 4) to provide an initial high level resetting pulse on the line 55. This pulse is applied through the OR gate 71 to reset the bistable device 70 and through the line 109 and OR gate 108 (FIG. 6) to reset the bistable device 107. Resetting the device 70 also provides a signal on line 81 to reset the bistable device 82 (FIG. 5) through the OR gate 83 and to reset the bistable device 85. The resetting pulse on line 55 is applied through an inverter 240 (FIG. 4) a line 241 and a further inverter 242 (FIG. 3) to the base of a pnp transistor 243 to rer-ove the fifteen volt supply from all of the energising circuits of the switching arrangement 46, and thereby to ensure that all thyristors are initially switched off.

As described above the low-level logic 1 signals on line 15 from the computer 16 are inverted by the amplifier 60 (FIG. 4) to provide high-level logic 1 signals on the line 65. The first of the data bits from the computer 16, that is the "start" bit, sets the bistable device 70 and thereby starts the multivibrator clock 75 which applies pulses on the line 76 to operate the counter 80. Setting the device 70 also causes the device 73 to be set providing one input to the AND gate 78. Inverted clock pulses from the multivibrator 75 are also applied to the AND gate 78 to provide, on the line 79, clock pulses which lag those on the line 76 by a half cycle. Data pulses on the line 65 are supplied to the register 120 (FIG. 7) and are clocked into this register by the pulses on line 79. FIG. 21 shows the time relationships of the signals in the distributor arrangement 13, the several signals being identified by the numbers of the lines or devices on which these signals appear. Delay of the clock pulses on line 79 by one half cycle ensures that serial data on the line 65 is correctly clocked into the register 120. Since the device 85 is still reset, when the value in the counter 80 reaches 3 the AND gate 91 provides a signal on the line 92 to the AND gate 110 (FIG. 6). It is arranged that in the event of a malfunction the first three data bits from the computer will be logic 1, that is the "start" bit, the "fault" bit and the first of the address bits. By the time the value in the counter 80 reaches 3 the first three bits will have been clocked into the register 120 and will be available on the lines 111 to the AND gate 110. In the event of a malfunction, therefore, the AND gate 110 will at this stage reset the device 107 (FIG. 6) through the OR gate 108. The AND gates 104, 106 will thereby be disenabled and removal of signals from lines 112, 113 will cause inhibit signals to be provided on all of the lines from the zero voltage detection arrangement 39 (FIG. 13) and switching of the heater loads will thereby be arrested, at this stage. If the device 107 is reset in response to a fault condition there will be no signal on either of lines 112, 113, whereby inhibit signals will be present on all of the lines 149, 150, 155, 156, 160 and 161, and no switching signals will be supplied from the de-multiplexing unit 45. It is arranged moreover, that if the computer 16 detects a fault the next address data will be such as to indicate a non-existent heater, thus ensuring that none of the switches S1 to S23 is operated.

In the absence of a fault condition, when the value in the counter 80 reaches 5 a signal is applied to one input of the AND gate 89, but the signal on line 72 remains at logic 0 since at this stage the bistable device 85 is still reset. When the counter 80 reaches the value 7 the AND gate 93 provides a signal on the line 94 indicating that the four data bits for a new switching instruction have been entered in the register 120. When the voltage on supply line C next reaches zero volts the flip-flop 102 triggers the delay device 103 which provides an output on line 84 after a delay of 0.2 milliseconds, setting the device 107. Gate 104 thus has signals at both its inputs and provides a signal on the line 112 to the AND gates associated with the detector circuit 193 (FIG. 13). The output of the flip-flop 102 remains at logic 1 until the next occasion when zero volts on the supply line C provides a signal on line 101, by which time the value in counter 80 has advanced to 8 and there is thus no signal from the AND gate 100. The resulting logic 0 output from the flip-flop 102 causes the device 103 to provide a zero output 0.2 milliseconds after the beginning of the signal on line 101. There is thus no signal on line 112 but, since the device 107 is set, a signal is applied by gate 106 through line 113 to the AND gates associated with the detector circuit 190, 191, 192 (FIG. 13).

The signal on line 94 from gate 93 also sets the device 82, providing a signal on the line 95 to the inhibit input of the counter 80. Counter 80 is thus arrested at the value 7 until the signal on line 84 resets the device 82, whereupon counting recommences. The signal on line 84 is applied through line 122 to the latch device 121, and data in the register 120 is applied on the lines 123 to the de-multiplexer arrangement 45 (FIG. 9) and to the register 124. Since the signal remains on line 84 after the clock 80 has moved on to a count of 8 the device 85 is set through the gate 86, and the next clock pulse on line 88 causes the gate 87 to provide a clock pulse on line 90 to the register 124. While the counter 80 has a count value of 8, the high level signal at its terminal 9 is applied through line 97 to terminal 9 of the register 124, permitting the signals on lines 123, and the 5v and 0v signals on terminals 1 and 5 respectively, to be loaded in parallel into the register 124. The next six clock pulses on line 90 cause the data in the register 124 to be read out serially and to control the transistor 128 to apply this data as five inverted serial pulses on the line 131 to the line 15 and thence back to the computer 16. These return pulses enable the computer 16 to confirm that the data has been correctly received and advanced by the distributor arrangement 13.

The counter 80 continues to step onwardly and on the next occasion when there is an output at its terminal 1 the set state of the device 85 causes AND gate 89 to provide a signal on line 72 which resets the device 70 through the OR gate 71 (FIG. 4). The distributor arrangement 13 as a whole is reset to await receipt of the next switching data on line 15.

A switching operation of the system will now be described with reference to the switch means previously described in connection with FIG. 16. It is to be assumed that the switching data from the computer 16 is such as to cause the de-multiplexer arrangement 45 to provide the control signals S1a1, S1a2, S2b1, S2b2, S3c1 and S3c2, these six signals being provided by separate ones of the de-multiplexing units 140 to 145 (FIG. 9). However, none of these signals will be provided except when the inhibit signals I on the respective lines 149, 150, 155, 156, 160 and 161 are at logic 0.

As described above when the system is first switched on the device 107 (FIG. 6) is reset and there is consequently no signal on either of lines 112, 113. The inhibit signals I on the lines 149, 150, 155, 156, 160, 161 are thus all at logic 1 and no switching action can take place. The device 107 is set only after receipt of a signal on line 101 indicating that voltage Vc is zero, being either positive or negative-going, whereupon the switching sequence starts. Once the device 107 is set, a logic 1 signal is provided on the line 112, the signal on line 113 remaining at logic 0, so that response of the system to the next succeeding zero voltages on supply lines B and A is prevented.

If, as shown in FIG. 18, the detected zero voltage Vc is positive-going, the next detected zero voltage Vac is also positive-going. As indicated by the table in FIG. 22, with the signal on line 112 at logic 1 and Vac at zero and positive-going, the inhibit signals I on lines 150 and 160 are zero. Control signals S1a1 and S3c2 are passed to the switch arrangement of FIG. 16, and thyristors A1 and C2 are switched on. The delay of 0.2 milliseconds imposed by the device 103 ensures that the next zero sensing of voltage Vc does not switch on thyristor C1, since at this time an inhibit signal is maintained on line 149 by the logic 0 on line 113. However, the aforesaid next zero detection of voltage Vc causes the flip flop 102 to change state, and 0.2 milliseconds thereafter the signal on line 112 becomes logic 0 and that on line 113 becomes logic 1. The inhibit signals therefter respond to detected zeros of voltages Va, Vb and Vc. When voltage Vb is zero and positive going the inhibit signal I on line 155 becomes logic 0 and thyristor B1 is switched on. The three phases of the supply are thereafter sequentially switched at zero volts in this manner while the original switching data remains on the lines 123.

Transfer of the voltage supply to a different heater is effected by passing a new set of switch data to the distributor arrangement 13 from the computer 16, and this data is clocked into the register 120, as before. Data from the register 120 is passed to the lines 123 through the latch device 121 only after the phase-advanced sensed voltage Vc is at zero. In the example shown in FIG. 18 the voltage Vc is positive-going. Since at this time the signal on line 113 is logic 0, thyristor B1 ceases conducting when the voltage on line B reaches zero. Thyristors A2 and C1 continue to conduct until the voltage between lines A and C reaches zero. At this stage, however, the next phase-advanced voltage Vac is already present and thyristor switching of the next heater starts. It will be seen from FIG. 18 that transfer of the voltage supply between the several loads is effected with an interruption which is limited to half a cycle of the supply on line B.

Phase-advance of the voltages Va, Vb, Vc, and Vac ensures that the thyristors are energised in advance of the zero voltage conditions and that every phase of the voltage supply is thus properly switched at zero volts. Radio frequency interference is thereby substantially eliminated. Moreover, transfer of the voltage supply between successive heater loads as shown in FIG. 18 substantially reduces shocks to the generating equipment.

Alternative start-up and transfer sequences may be initiated when the sensed voltage Vc is zero and negative-going, in which case the next zero voltage Vac is also negative going, and the inhibit signals I on the lines 161 and 149 become logic 0. As indicated in FIG. 9 control signals S1a2 and S3c1 are then applied to the switch arrangement to operate thyristors A2 and C1. After the signal on line 113 has become logic 1, thyristor B2 is operated when voltage Vb is zero. The three phases of the supply are thereafter switched sequentially as described above. It will readily be understood that transfer of the voltage supply to a different heater may also be initiated when the sensed voltage Vc is zero and negative going.

The alternative arrangement of FIG. 19 shows thyristor switches T1 to T6 for three resistive loads arranged in delta connection between supply lines A, B, C. Such an arrangement may be controlled by a system substantially as previously described, control signals t1 to t6 being obtained from respective ones of the de-multiplexing units 140 to 145, as before. In this alternative, however, it is necessary only to sense the zero voltage conditions between the three phases, and the zero voltage detection arrangement will thus require only three detector circuits.

Transfer of voltage supply to the next succeeding heater is initiated by a phase-advanced signal adjacent the positive-going or negative-going zero voltage crossover between voltages on the lines A and C, and this phase-advanced signal controls the signal on line 122 to the latch device 121 (FIG. 7), thereby applying the next switch data to the de-multiplexer arrangement. The phase-advance allows the gate signal to be applied to the first thyristor of the next heater load before the voltage difference across that thyristor reaches its zero crossing point. In this arrangement there is, therefore, no interruption of the load on any phase of the supply.

It is, however, a disadvantage of delta connected loads that, for example, an earth fault on one of the loads has an effect on current flow through the remaining loads. It may therefore be required to provide star connection, for which purpose the first embodiment provides a suitable switching system.

The computer 16 is programmed to operate on three levels of priority. The highest priority level A relates only to the operation of a data link software routine for transfer of switching data on the line 15 between the computer 16 and the distributor 13. The data link routine includes reception of data from the register 124. During operation in priority level A, all computer interrupts are disenabled. In the next lower priority level B the interrupts are enabled and the computer 16 determines the switch-on time for each load, in accordance with the sensed outside air temperature, in a manner described hereafter. In priority level B the computer 16 selects the successive stored switching data, as described below, and also samples the values in the fault detector circuits 30. In priority level C the computer 16 carries out a self-test program which includes checks on the de-multiplexer 29 and the analog to digital converter 31.

The EPROM 21 (FIG. 2) contains the control program for the computer 16, and also contains the predetermined switching codes for the heaters, these codes comprising ten 8-bit switch code numbers, each of which identifies a selected switched condition. The bits of each switch code number are supplied as a series of 0.5 millisecond bits on the line 15 to the distributor arrangement 13. The computer 16 supplies the switch codes in response to a signal from the ice detector 19 (FIG. 1), the times between supply of the successive switch codes being dependent on the outside air temperature signal on line 28 from the sensor 18, this signal being sampled every second in response to signals from the RAM 22, under control of the clock 25 (FIG. 2). The digital equivalent (OAT) of the air temperature analog signal is stored in a location in the RAM 22, over-writing the value previously held in that location.

A routine for generation of a required sequence of switch codes is indicated in FIG. 23. The times for which heater may be switched on are stored in a look-up table in the EPROM 21, and a value is selected from this table in accordance with the outside air temperature value OAT, and the selected value stored as "ON TIME" in the RAM 22. The RAM 22 also includes a counter in which a value "TIMING" is incremented every 10 milliseconds and compared with the ON TIME value. When ON TIME is equal to TIMING, a value "SEQUENCE" in a further counter in the RAM 22 is incremented. The value SEQUENCE corresponds to the address of the current switching code in the EPROM 21, so that incrementing SEQUENCE calls up the next switching code from the EPROM 21 and loads this code into a location, hereinafter referred to as NEXT CODE in the RAM 22. The TIMING value is then set to zero. The SEQUENCE value is also compared with a previously determined value (MAX) which corresponds to the total number of steps in the switching cycle, and when the values are equal, of SEQUENCE and MAX, SEQUENCE is reset to an initial value (INIT), so that the system continues to cycle through the predetermined switching sequence. In the present example the switching cycle comprises twenty steps, some of the switched conditions being set more than once in the switching cycle.

Each of the successive switching codes is sent serially to the distributor arrangement 13 by way of the RAM 22, the amplifier 27 and the line 15. A flow chart for the data link software routine for transmission and reception of data on the line 15 is shown in FIG. 23. This data link routine is entered every 0.5 milliseconds and initiates priority level A operation, which is maintained for the next sixteen successive 0.5 millisecond intervals.

During the first three milliseconds of the data link routine the start bit, the fault bit and the four switching data bits are transmitted, to the distributor arrangement 13 on the line 15. Thereafter the switching data is loaded into the register 124 (FIG. 7) and returned to the computer 16 on the line 15, by way of the amplifier 26 (FIG. 2).

The RAM 22 also contains store locations as defined below in terms of their contents and function, the relationships of the contents of these locations being indicated in the flow chart of FIGS. 24 and 25, which outline the data link routine.

FAULT Indicates that a fault has been detected by the fault detector circuits 30 (FIG. 2)

SEND A value which is initially set to 3 and is subsequently decremented by unity each time a switching code which has been transmitted on the line 15 is not received back in identical form from the register 125 (FIG. 7). When the SEND value is 1, a malfunction signal is generated and the complete system is shut down by the computer 16. When a switching code has been correctly received back from the distributor arrangement 13 then SEND is set to 0.

BIT COUNT Is set to 17 by initialisation of the computer program, by the routine for switching sequence generation, or at the completion of a send/receive cycle of the data link routine. The BIT COUNT is decremented by unity at each of the sixteen 0.5 millisecond periods of the data link routine. If BIT COUNT reaches zero then seventeen such periods will have elapsed without the correct code being retransmitted, and the computer 16 shuts down the complete system.

DATA The 8 bit code which is currently to be sent to the distributor arrangement 13. This code may be the current switching code, which is obtained from the aforementioned NEXT CODE location, also in the RAM 22. The DATA location can also receive the contents of FAULT store.

MASK An eight bit number comprising seven 0 bits and a single 1 bit which can be stepped onwards from the position of the least significant bit (BIT=0) in response to a MOVE MASK instruction. The MASK number is successively logically ANDED with the DATA value, so that the bits of the DATA value are successively transmitted serially.

RECEIVE Holds the data retransmitted back to the computer from the register 124 (FIG. 7)

POINTER An eight bit number comprising seven 0 bits and a single 1 bit which can be stepped onwards from the least significant bit position (BIT=0) in response to a MOVE POINTER instruction. The POINTER number is successively ANDED with the data returned from the register 124 and the result successively added to the value in the RECEIVE store. The POINTER thus acts to convert the serial return signals from the register 124 into an 8 bit number in the RECEIVE store.

As shown in FIGS. 24 and 25 the data link routine starts at "BEGIN" and first checks whether a fault has been detected by the circuits 30 (FIG. 2). The routine then determines whether the SEND value is zero, and if so the routine jumps by way of the route (i) to its end, as shown in FIG. 25 at "END". As indicated above the data link routine will recommence at BEGIN at the next level A priority not more than 0.5 milliseconds later.

If the SEND value is other than zero the routine can proceed, and determines if the value of BIT COUNT is zero. If so the routine jumps by way of the route (ii) to a SHUT DOWN instruction (FIG. 25) which causes the system to cease operation. If the BIT COUNT value is other than zero then data transfer is either in process, or may proceed. The routine checks whether the BIT COUNT value is equal to 17, and if so the contents of the NEXT CODE store are loaded into the DATA store, for subsequent serial transmission over the line 15. The data in the MASK and POINTER locations is set so that bit 0 is equal to 1 in each case. The contents of the RECEIVE store are set to zero.

The contents of the FAULT location are again checked and if a fault is present the fault code, that is a condition in which the first three bits of the serial data to be transmitted are all at logic 1, is set in the DATA store, and, as previously described, causes signals to be applied to all of the inhibit inputs of the de-multiplexer arrangement 45 (FIG. 9). In either case the BIT COUNT value is decremented by unity. If the BIT COUNT value is neither 17 nor zero, a data transfer is already in progress, and the routine goes directly to decrement BIT COUNT, without transferring the next switching code NEXT CODE, or resetting the MASK, RECEIVE and POINTER values. If the logic 1 in MASK is not yet at bit 7, a READ MASKED DATA instruction causes the bit in the DATA store which is selected by the MASK bit to be transmitted by way of an output port of the RAM 22 on to the line 15. The indicator bit in MASK is then shifted to the next more significant bit by a MOVE MASK instruction and the next bit from DATA can then be transmitted. The routine passes to END by the route (iii) and restarts at BEGIN 0.5 milliseconds later.

The routine then recycles until the MASK is set to bit 7, whereupon a READ INPUT instruction enables the RAM 22 to receive switch codes which are returned from the distributor arrangement 13.

A ONE? enquiry determines whether the current one of the serially returned bits is 1 or 0. If the bit in question is 1 the 1 bit in POINTER is added to the corresponding location in the RECEIVE store, and the POINTER bit is advanced to the next more significant position. If the resultant POINTER bit position is bit 1, that is the next to least significant bit, the POINTER bit is moved on by a further step. This is because bit 1 of the switching data is the fault bit, and the presence of this bit, in conjunction with the start bit and the first bit of the switch indication will already have combined, through AND gate 110 (FIG. 6), to inhibit operation of the switching signals. There is thus no need to check for satisfactory return of the fault bit. If the POINTER bit position is not 1, the POINTER is checked to determine whether its bit is in position 6, which will indicate all of the serially returned data bits have been entered in the RECEIVE store.

The routine continues, by route (V), to check whether the contents of the DATA and RECEIVE stores correspond. If so, the SEND and BIT COUNT values are set to zero, indicating that the switching code has been correctly transmitted and that a step of the data transmission sequence is complete and the routine goes to END. If the contents of the DATA and RECEIVE stores do not correspond, the SEND value is decremented by unity, and if the resulting value is still greater than unity the BIT COUNT value is reset to 17 and the routine ends. As indicated above the routine is re-entered on the next priority level A operation 0.5 milliseconds later. The routine will then be repeated with the same switching code until SEND COUNT is equal to unity, when the SHUT DOWN instruction causes the system to cease operation.

If after the READ INPUT instruction, the ONE? enquiry had shown the currently received bit to be 0, a POINTER = BIT 0? enquiry indicates whether a start bit has been received from the distributor. A YES answer indicates that the start bit has not been received, and the routine goes to END by route (iv). If POINTER is at other than bit 0 and the currently read bit is 0, nothing is added to the RECEIVE store and the POINTER is moved on.

If the POINTER = BIT 6? enquiry reveals that the pointer position has not yet reached that value, the routine goes to END by route (vi) and restarts at BEGIN 0.5 milliseconds later.

I claim:

1. A switching system for maintaining substantially constant the load on a three-phase supply voltage when switching among a plurality of loads, each of said loads comprising a plurality of elements arranged in at least one three wire group, said system comprising a plurality of switch means for connecting respective at least ones of said loads to said supply, means for providing a plurality of signal codes in a predetermined sequence, a decoding circuit, responsive to said signal codes, for supplying control signals to at least ones of said switch means indicated by said signal codes, and for causing said switching in a sequence indicated by said codes, inhibiting means for preventing operation of said switch means except when the voltages on the respective supply phases have substantially zero magnitudes, means for generating first indicating signals when the magnitude of the voltage on one of said phases is adjacent zero, and means for generating second indicating signals on a subsequent occasion when the magnitude of the voltage on said one phase is adjacent zero, said inhibiting means including means, responsive to said first indicating signals, for preventing supply of said control signals except those for switch means between a predetermined two of said phases and means, responsive to said second indicating signals, for preventing supply of said control signals to said switch means between said predetermined two phases and for permitting supply of said control signals to the remainder of said switch means.

2. A system as claimed in claim 1 which includes means, responsive to the presence of said supply voltage and to the absence of any of said signal codes, for generating third indicating signals, said inhibiting means including means responsive to said third indicating signals for preventing said decoding circuit from supplying any of said control signals.

3. A system as claimed in claim 1 wherein said predetermined two phases comprise said one phase and the next succeeding phase.

4. A system as claimed in any one of claims 1, 2 or 3 in which said means for supplying said signal codes includes means for generating each said code as a series of discrete signals, and in which there is provided means, responsive to at least one signal in each said series, for generating a first timing signal when all of the signals of a series have been received from said signal code supply means, said means for generating the first indicating signal being responsive to said first timing signal and to a substantially zero voltage on said one phase.

5. A system as claimed in claim 4 which includes means responsive to a combination of said first timing signal and to said subsequent zero voltage on said one phase, for generating a second, subsequent timing signal, said means for generating the second indicating signal being responsive to said second timing signal and to the next successive substantially zero voltage on said one phase.

6. A system as claimed in claim 1 in which said loads are arranged in a plurality of three-wire groups and said switch means comprises a plurality of groups of three, each one of said switch means providing a connection to a respective one of the loads in one three-wire group, and one switch means in each of said group of three provides a connection to a load in another three-wire group.

7. A system as claimed in claim 6 in which connections to all of the loads in one of said three-wire groups are provided by one switch means in each of three separate switch groups.

8. A system as claimed in claim 7 in which connections to all of the loads in one of said three-wire groups are provided by one switch means in each of three separate switch groups.

* * * * *